(12) United States Patent
Shibata et al.

(10) Patent No.: US 6,774,440 B1
(45) Date of Patent: Aug. 10, 2004

(54) SEMICONDUCTOR DEVICE AND METHOD FOR DRIVING THE SAME

(75) Inventors: Akihide Shibata, Nara (JP); Hiroshi Iwata, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/424,966

(22) PCT Filed: Mar. 9, 1998

(86) PCT No.: PCT/JP98/00963

§ 371 (c)(1),
(2), (4) Date: Mar. 6, 2000

(87) PCT Pub. No.: WO98/54762

PCT Pub. Date: Dec. 3, 1998

(30) Foreign Application Priority Data

May 30, 1997 (JP) .............................................. 9-142575

(51) Int. Cl.$^7$ ......................... H01L 29/76; H01L 29/94; H01L 31/062
(52) U.S. Cl. ......................... 257/369; 257/368; 257/371
(58) Field of Search ................................. 257/368, 369, 257/371, 276

(56) References Cited

U.S. PATENT DOCUMENTS 3,865,654 A * 2/1975 Chang et al. ................ 257/371
5,786,617 A * 7/1998 Merrill et al. ............... 257/371

FOREIGN PATENT DOCUMENTS

| JP | 63-53967 | 3/1988 | | |
|---|---|---|---|---|
| JP | 03-082151 | 4/1991 | | |
| JP | 3-178170 | 8/1991 | | |
| JP | 4-125960 | 4/1992 | | |
| JP | 6-120439 | 4/1994 | | |
| JP | 7-78885 | * 3/1995 | ................. | 257/371 |
| JP | 8-204140 | * 8/1996 | ................. | 257/351 |
| WO | PCT/JP97/04344 | 11/1997 | | |

OTHER PUBLICATIONS

Partial English translation of Japanese Patent Application No. 08–204140 from the Japanese Patent Office.*
U.S. patent application Ser. No. 08/881,697, Iwata, et al., filed Jun. 24, 1997.
F. Assaderaghi et al., IEDM 94, pp. 809–812 "A Dynamic Threshold Voltage MOSFET (DTMOS) for Ultra–Low Voltage Operation".

* cited by examiner

Primary Examiner—Steven Loke
(74) Attorney, Agent, or Firm—Morrison & Foerster LLP

(57) ABSTRACT

In a semiconductor element (1) provided with a source region (3) and a drain region (4) both formed in a well (2), and a gate electrode (7) fabricated on a channel region (5), formed between these regions, through a gate insulting film (6), each element is electrically isolated by means of an SOI substrate and a field oxide film, for example, and a substrate terminal (TW) is pulled out from the channel region (5) via a contact hole formed through an inter-layer insulating film in each element at a region other than the source region (3) and drain region (4). Consequently, a 2-input-1-output element having the gate terminal (TG) and substrate terminal (TW) as two inputs can be realized, thereby making it possible to improve a packing density and operating rate while reducing the costs when forming a logic circuit or the like.

17 Claims, 19 Drawing Sheets

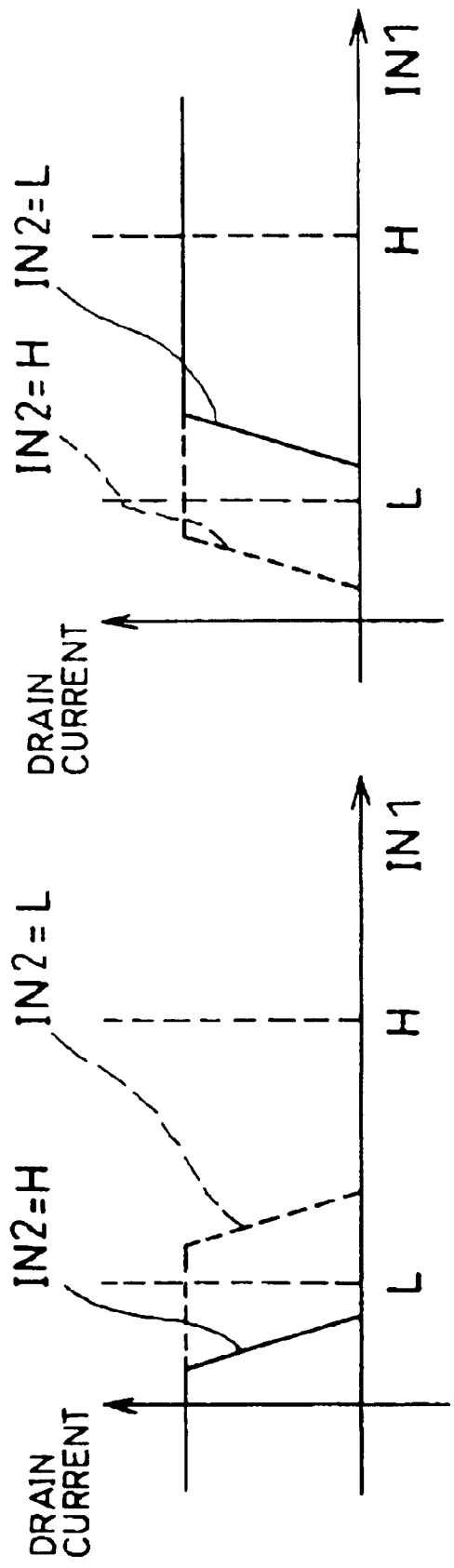

US 6,774,440 B1

SEMICONDUCTOR DEVICE AND METHOD FOR DRIVING THE SAME

This application is a National Phase application of PCT/JP98/00963, filed on Mar. 9, 1998.

TECHNICAL FIELD

The present invention relates to a semiconductor device realized by a semiconductor element, such as a MOSFET, and a method of driving the same to operate in certain manners.

TECHNICAL BACKGROUND

A MOSFET controls electrical conduction between the source and drain by varying a voltage applied to the gate electrode. For example, in case of an N-type MOSFET, the conduction between the source and drain is allowed when a high level is inputted into the gate electrode, and stopped when a low level is inputted. Here, the potential of the well is generally fixed. More specifically, the potential is fixed at the low level in the N-type MOSFET, and the high level in a P-type MOSFET. In this manner, the conventional MOSFET is used as a 3-terminal element which controls the switching between the source and drain by using the gate electrode as an input.

FIG. 22 shows an example application of the above MOSFET by way of a circuit diagram of a logic circuit log1 as a typical conventional semiconductor device. The logic circuit log1 comprises (1) a pair of circuits of PMOSFETs (qp1 and qp2) in parallel, which are respectively provided with inputs in1 and in2 through input terminals p1 and p2, and connected to a high level $V_{DD}$ power source line at one end and to an output terminal p3 at the other end, and (2) a pair of circuits of NMOSFETs (qn1 and qn2) in series, which are respectively provided with the inputs in1 and in2, and connected to the output terminal p3 at one end and to a low level GND power source line at the other end, thereby forming a NAND circuit which shifts its output OUT to the high level when at least one of the inputs in1 and in2 is in the low level.

Also, FIG. 23 is a circuit diagram of a logic circuit log2 of another conventional semiconductor device. The logic circuit log2 comprises (1) a pair of circuits of PMOSFETs (qp1 and qp2) in series, which are respectively provided with the inputs in1 and in2, and connected to the high level $V_{DD}$ power source line at one end and to the output terminal p3 at the other end, and (2) a pair of circuits of NMOSFETs (qn1 and qn2) in parallel, which are respectively provided with the inputs in1 and in2, and connected to the output terminal p3 at one end and to the low level GND power source line at the other end, thereby forming a NOR circuit which shifts its output OUT to the low level when at least one of the inputs in1 and in2 is in the high level.

The logic circuits log1 and log2 representing the conventional semiconductor devices are arranged in such a manner that each MOSFET outputs one output in response to one input, and for this reason, the NAND circuit or NOR circuit demands four MOSFETs. Further, because an AND circuit is realized by connecting a NOT circuit (composed of two MOSFETs) to the NAND circuit in series, and an OR circuit is realized by connecting the NOT circuit to the NOR circuit in series, the AND circuit or OR circuit demands six MOSFETs. Accordingly, a large number of MOSFETs are necessary to run one operation, which makes it difficult to improve a packing density of the semiconductor device. Consequently, neither can the operating rate and yield be improved, nor the costs can be reduced.

An object of the present invention is to provide a semiconductor device capable of improving a packing density by upgrading performance of each element, and increasing an operating rate and yield, while reducing the costs, and a driving method thereof.

DISCLOSURE OF THE INVENTION

A first semiconductor device of the present invention is furnished with:

a semiconductor substrate;

a background insulating film formed over the semiconductor substrate;

a P- or N-type semiconductor layer which is formed over the background insulating film and made into a first electrode, the semiconductor layer in each element being separated from the semiconductor layer in an adjacent element by means of an electrical insulating separation region encircling each element;

a source region and a drain region formed in the semiconductor layer and made into a second electrode and a third electrode, respectively, the source region and drain region having a conduction type opposite to a conduction type of the semiconductor layer;

a channel region formed between the source region and drain region;

a gate insulating film formed over the channel region; and a gate electrode formed as a fourth electrode on the gate insulating film, wherein a contact hole is formed through the semiconductor layer for each element separated by means of the separation region, at a region other than the source region and drain region.

According to the above arrangement, by employing a substrate of an SOI (Silicon On Insulator) or SOS (Silicon On Sapphire) structure, in which elements are fabricated on the background insulating film formed over the semiconductor substrate, element forming regions for individual elements can be electrically separated from each other relatively easily by means of the separation region. Then, a MOSFET is formed in each separated element forming region under the conditions where each element is allowed to operate independently by preventing interference between the elements. Further, the semiconductor layer in each MOSFET is electrically connected to the outside through the contact hole, so that it can be used as an electrode, thereby realizing a 4-terminal element having two inputs: the input to the gate and the input to the semiconductor layer.

Consequently, a 2-input-1-output circuit can be realized by a single element, thereby upgrading the performance of the MOSFET itself. Accordingly, when a logic circuit is formed, not only can a packing density of an integrated circuit, an operating rate, and yield be improved, but also the costs can be reduced.

A second semiconductor device of the present invention is furnished with:

a semiconductor substrate;

a P- or N-type deep well region formed in the semiconductor substrate;

a shallow well region formed over the deep well region and made into a first electrode, a conduction type of the shallow well region being opposite to a conduction type of the deep well region;

a source region and a drain region formed in the shallow well region and made into a second electrode and a third electrode, respectively, the conduction type of the source region and drain region being opposite to a conduction type of the shallow well region;

a channel region formed between the source region and drain region;

a gate insulating film formed over the channel region; and a gate electrode formed as a fourth electrode on the gate insulating film, wherein:

at least the shallow well region in each element is electrically separated from the shallow well region in an adjacent element by means of a separation region; and a contact hole is provided to the shallow well region in each element separated from the shallow well region in the adjacent element by means of the separation region, at a region other than the source region and drain region.

According to the above arrangement, by electrically isolating the shallow well region in each element forming region by means of the separation region, a MOSFET can be formed in each separated element forming region even when a bulk substrate is employed, so that each element can operate independently by preventing interference between the elements. Further, the shallow well region in each MOSFET is electrically connected to the outside through the contact hole, so that it can be used as an electrode, thereby realizing a 4-terminal element having two inputs: the input to the gate and the input to the shallow well region.

Consequently, a 2-input-1-output circuit can be realized by a single element, thereby upgrading the performance of the MOSFET itself. Accordingly, when a logic circuit is formed, not only can a packing density of an integrated circuit, operating rate, and yield be improved, but also the costs can be saved. Moreover, the costs and resistance of the first electrode can be reduced further compared with a case where the SOI or SOS substrate is employed.

The first and second semiconductor devices are preferably arranged in such a manner that:

the elements having opposite conduction types are paired off;

a source of a P-type semiconductor element is fixed at a high potential, and a source of an N-type semiconductor element is fixed at a low potential;

gates of the P-type semiconductor element and N-type semiconductor element are connected to each other, thereby to form a first input terminal;

the contact holes in the P-type semiconductor element and N-type semiconductor element are connected to each other, thereby to form a second input terminal; and drains of the P-type semiconductor element and N-type semiconductor element are connected to each other, thereby to form an output terminal.

In this case, the CMOS inverter structure, in which, of the two MOSFETs of P- and N-types, the source of the PMOSFET is fixed at the high potential while the source of the NMOSFET is fixed at the low potential, and the drains of the PMOSFET and NMOSFET are connected to each other, thereby to form an output, is further arranged such that the contact holes in the PMOSFET and NMOSFET are connected to each other, thereby to form the second input terminal, and the gates, namely the normal inputs, of the PMOSFET and NMOSFET are connected to each other, thereby to form the first input terminal.

Consequently, a NAND or NOR circuit can be realized by adequately adjusting potentials of the two inputs or impurity concentration in the channel region. Accordingly, the NAND or NOR circuit which conventionally demands four MOSFETs can be now realized by two MOSFETs.

Further, the first and second semiconductor devices are preferably arranged in such a manner that:

the elements having opposite conduction types are paired off;

a source of a P-type semiconductor element is fixed at a high potential, and a source of an N-type semiconductor element is fixed at a low potential;

both a gate of the P-type semiconductor element and the contact hole in the N-type semiconductor element form a first input terminal;

both a gate of the N-type semiconductor element and the contact hole in the P-type semiconductor element form a second input terminal; and drains of both the N-type semiconductor element and P-type semiconductor element form an output terminal.

In this case, the CMOS inverter structure, in which, of a pair of a PMOSFET and an NMOSFET, the source of the PMOSFET is fixed at the high potential while the source of the NMOSFET is fixed at the low potential, and the drains of the PMOSFET and NMOSFET are connected to each other, thereby to form an output, is further arranged such that the gates of the PMOSFET and NMOSFET form the first and second input terminals, respectively, and the contact holes in the NMOSFET and PMOSFET also form the first and second input terminals, respectively.

Consequently, a NAND or NOR circuit can be realized by adequately adjusting potentials of the two inputs or impurity concentration in the channel region. Accordingly, the NAND or NOR circuit which conventionally demands four MOSFETs can be now realized by two MOSFETs.

Further, the first and second semiconductor devices are preferably arranged in such a manner that:

the elements having opposite conduction types are paired off;

a drain of an N-type semiconductor element is fixed at a high potential, and a drain of a P-type semiconductor element is fixed at a low potential;

gates of both the N-type semiconductor element and P-type semiconductor element form a first input terminal;

the contact holes in both the N-type semiconductor element and P-type semiconductor element form a second input terminal; and sources of both the N-type semiconductor element and P-type semiconductor element form an output terminal.

In this case, an AND or OR circuit can be realized by adequately adjusting potentials of the two inputs or impurity concentration in the channel region. Accordingly, the AND or OR circuit which conventionally demands six MOSFETs can be now realized by two MOSFETs.

Also, the first and second semiconductor devices are preferably arranged in such a manner that:

the elements having opposite conduction types are paired off;

a drain of an N-type semiconductor element is fixed at a high potential and a drain of a P-type semiconductor element is fixed at a low potential;

both a gate of the N-type semiconductor element and the contact hole in the P-type semiconductor element form a first input terminal;

both a gate of the P-type semiconductor element and the contact hole in the N-type semiconductor element form a second input terminal; and drains of both the P-type semiconductor element and N-type semiconductor element form an output terminal.

In this case, an AND or OR circuit can be realized by adequately adjusting potentials of the two inputs or impurity concentration in the channel region. Accordingly, the AND or OR circuit which conventionally demands six MOSFETs can be now realized by two MOSFETs.

The first and second semiconductor devices are preferably arranged further in such a manner that:

the gate and the contact hole are used as separate input terminals, into which different input signals synchronized to each other are inputted, respectively. In this case, each element outputs one output signal in response to two input signals synchronized to each other based on a clock or the like. Hence, not a simple ON/OFF operation of a 1-input-1-output circuit, but an operation of a 2-input-1-output logic circuit can be realized, and therefore, the logic circuit can be composed of a fewer elements.

For a fuller understanding of the nature and advantages of the invention, reference should be made to the ensuing detailed description taken in conjunction with the accompanying drawings.

BRIEF DESCRIPTION OF THE DRAWINGS

FIGS. 20(a) and 20(b) are graphs showing operating characteristics of a logic circuit in accordance with a tenth embodiment of the present invention;

THE MOST PREFERRED EMBODIMENT OF THE INVENTION

The following will describe in detail the present invention with reference to accompanying drawings. Initially, referring to FIGS. 1 through 3, the following description will describe a first embodiment of the present invention.

Figure 1:
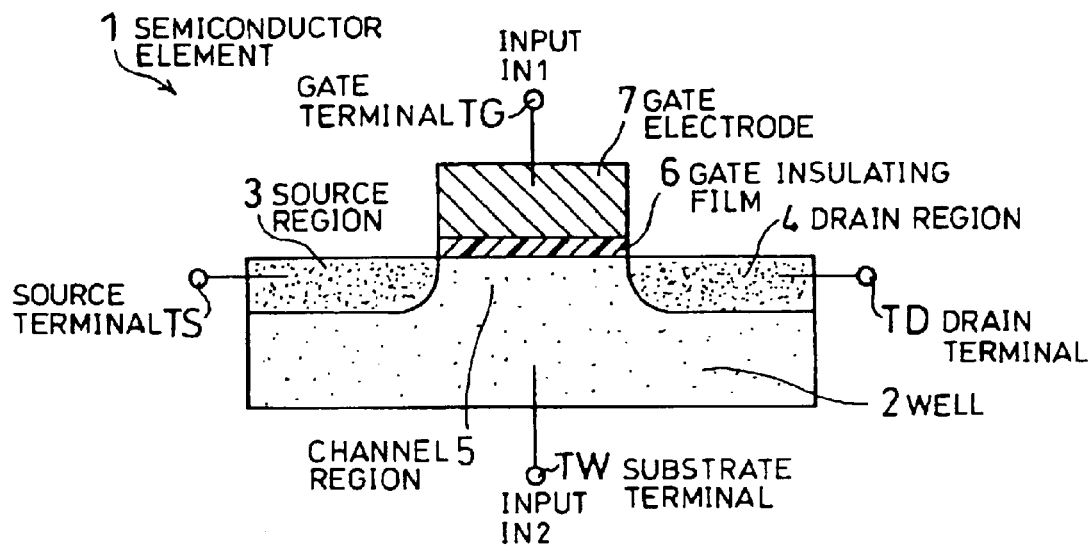
FIG. 1 is a cross section of a semiconductor element in accordance with a first embodiment of the present invention, showing a basic arrangement of the present invention.

FIG. 1 is a cross section schematically showing a semiconductor element 1 in accordance with the first embodiment of the present invention to explain a basic arrangement of the present invention. As shown in the drawing, in addition to a typical MOSFET structure, in which a source region 3 and a drain region 4 are formed in a well 2, and a gate electrode 7 is fabricated on a channel region 5 formed between the source region 3 and drain region 4 through a gate insulating film 6, the semiconductor element 1 has a 4-terminal structure, in which: a substrate terminal TW is pulled out from the well 2 through a contact hole (not shown) and made into a first electrode; a source terminal TS is pulled out from the source region 3 and made into a second electrode; a drain terminal TD is pulled out from the drain region 4 and made into a third electrode; and a gate terminal TG is pulled out from the gate electrode 7 and made into a fourth electrode. The gate terminal TG as the first input terminal and the substrate terminal TW as the second input terminal respectively receive inputs IN1 and IN2, which are different signals synchronized to each other based on a clock signal or the like. Here, an appropriate drain voltage is applied across the drain and source.

Figure 2:
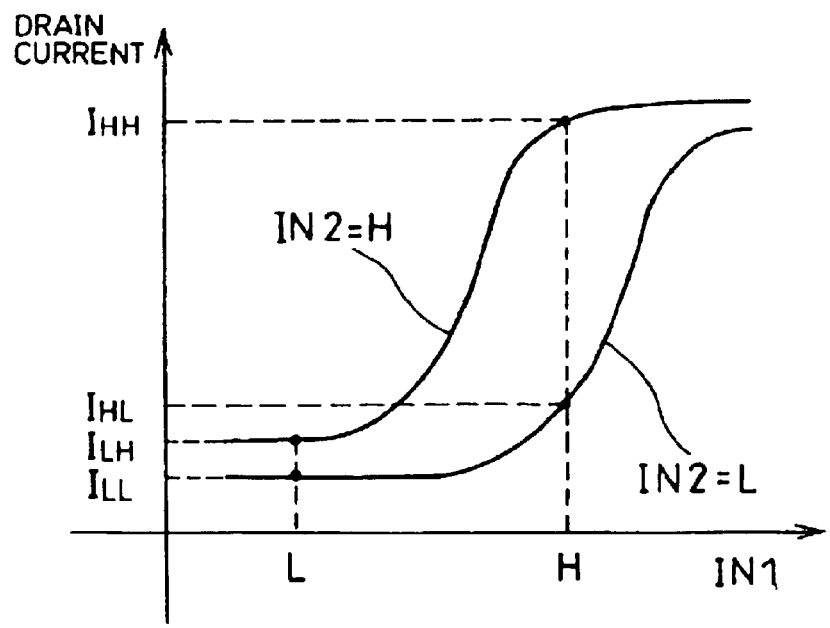
FIG. 2 is a graph showing an example of operating characteristics of the semiconductor element in FIG. 1.

In case that the semiconductor element 1 is an NMOSFET (having the well 2 of P-type), the relation of a drain current with respect to the potentials of the inputs IN1 and IN2 is as the one shown in FIG. 2. When the input IN2 (well potential) has a low potential (L), and the input IN1 (gate potential) has the low potential (L), $I_{LL}$ is yielded as the drain current. When the input IN2 has the low potential (L), and the input IN1 has a high potential (H), $I_{HL}$ is yielded as the drain current.

In contrast, when the input IN2 has the high potential (H) and the input IN1 has the low potential (L), $I_{LH}$ is yielded as the drain current. When the input IN2 has the high potential (H), and the input IN1 also has the high potential (H), $I_{HH}$ is yielded as the drain current.

As has been discussed above, with respect to the same input IN1, the drain current becomes larger with the input IN2 having a higher potential. This is because, in the MOSFET, when a positive voltage is applied to the well 2, a potential barrier in the channel region is reduced, and so is a threshold voltage.

FIG. 2 reveals that when the input IN2 has the low potential (L), more or less the same drain current is yielded whether the input IN1 has the high potential (H) or low potential (L), but when the input IN2 has the high potential (H), the drain current varies considerably depending on whether the input IN1 has the high potential (H) or low potential (L). Hence, the example case shown in FIG. 2 realizes an operation such that the conduction between the drain and source is allowed only when both of the inputs IN1 and IN2 have the high potential (H), and stopped otherwise.

Figure 3:
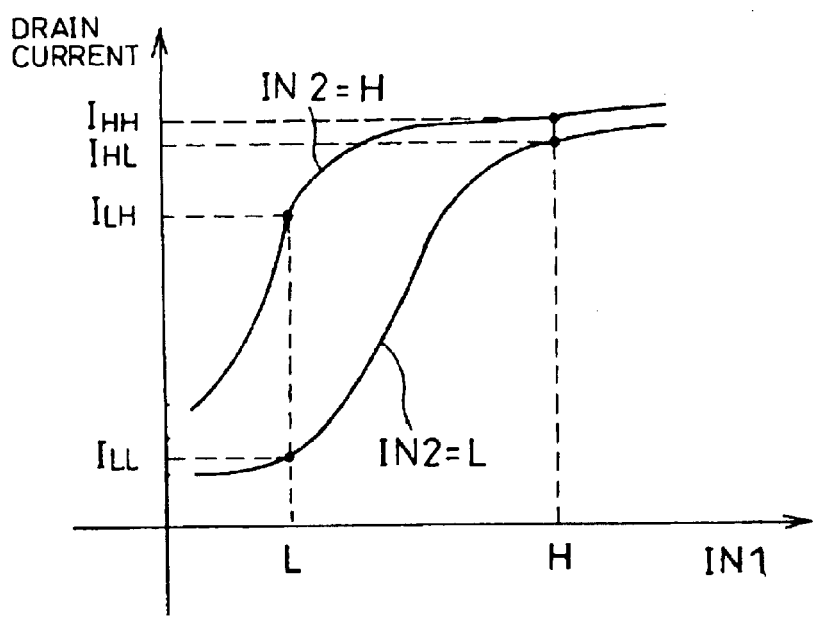
FIG. 3 is a graph showing another example of the operating characteristics of the semiconductor element in FIG. 1.

On the other hand, by setting the operating characteristics as shown in FIG. 3, an operation can be realized such that the conduction between the source and drain is allowed when at least one of the inputs IN1 and IN2 has the high potential (H), and stopped only when both of the inputs IN1 and IN2 have the low potential (L).

The characteristics shown in FIGS. 2 and 3 can be selected with the semiconductor element 1 arranged in the manner as shown in FIG. 1 by, for example, adequately adjusting impurity concentration in the channel region 5, or the levels of the high potential (H) and low potential (L) of the inputs IN1 and IN2. It should be appreciated that in case that the semiconductor element 1 is a PMOSFET (having the well 2 of N-type), the operating characteristics are opposite to those shown in FIGS. 2 and 3.

Consequently, a packing density of an integrated circuit can be improved by upgrading the performance of a single element capable of outputting one output in response to two different inputs IN1 and IN2 synchronized to each other.

Figure 4:
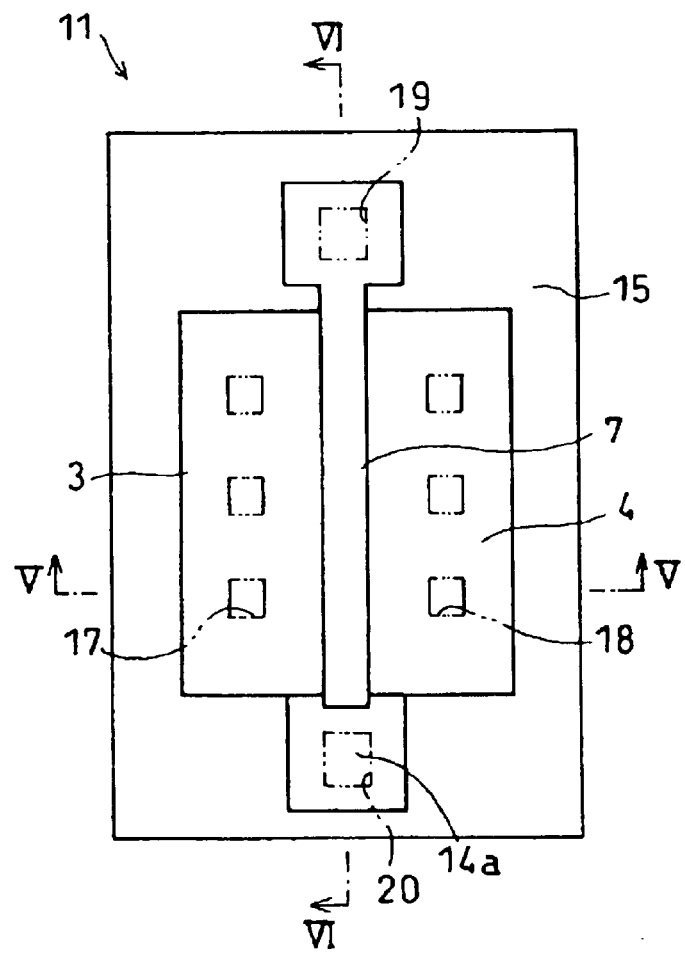
FIG. 4 is a front view of a semiconductor element in accordance with a second embodiment of the present invention, showing a practical application of the arrangement in FIG. 1.
Figure 5:
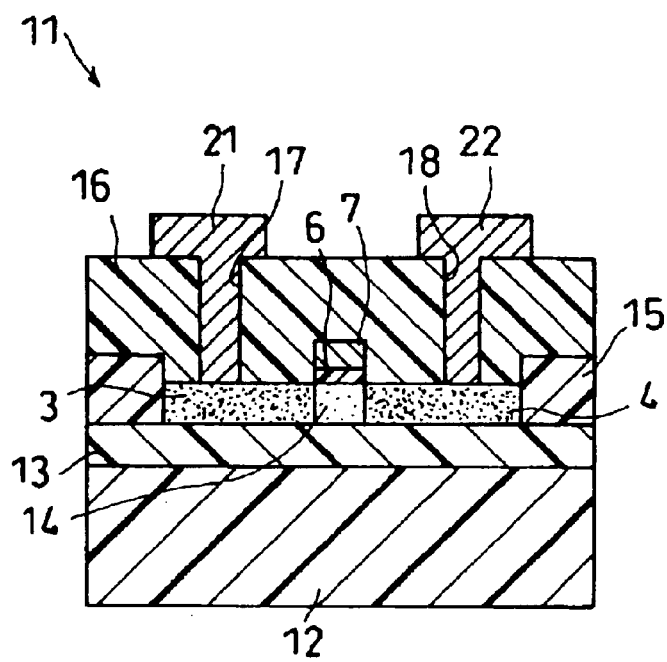
FIG. 5 is a perspective cross section taken on line V—V in FIG. 4.
Figure 6:
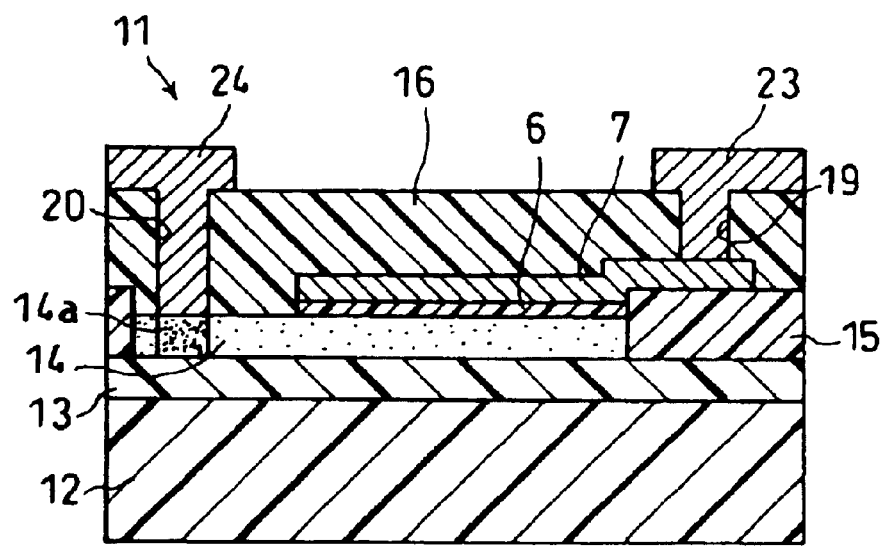
FIG. 6 is a perspective cross section taken on line VI—VI in FIG. 4.

Referring to FIGS. 4 through 6, the following description will describe a second embodiment of the present invention.

FIGS. 4 through 6 are views showing an arrangement of a semiconductor element 11, which is a practical application of the semiconductor element 1. FIG. 4 is a front view. FIG. 5 is a perspective cross section taken on line V—V in FIG. 4, and FIG. 6 is a perspective cross section taken on line VI—VI in FIG. 4. FIG. 4 omits top metal wires and an inter-layer insulating film hereinafter referred to and shows only a substantial part of the element for ease of explanation.

The semiconductor element 11 employs an SOI substrate composed of a semiconductor substrate 12, on which a background insulating layer 13 and a semiconductor layer 14 are formed sequentially in a vertical direction. The semiconductor layer 14 (well 2) in each element is electrically separated from the one in the adjacent element by means of a field oxide film 15, so that a change in well potential between the adjacent elements will not give any adverse effect. The source region 3 and drain region 4 are formed in the semiconductor layer 14. The conduction type of the source region 3 and drain region 4 is opposite to that of the semiconductor layer 14. For example, when the semiconductor element 11 is an NMOSFET, the semiconductor layer 14 is of the P-type, and the source region 3 and drain region 4 are of the N-type. The gate electrode 7 is fabricated on the channel region formed between the source region 3 and drain region 4 through the gate insulating film 6.

The element thus formed is covered with an inter-layer insulating film 16. Contact holes 17, 18, and 19 are formed through the inter-layer insulating film 16, so that top metal wires 21, 22, and 23 are electrically connected to the source region 3, drain region 4, and gate electrode 7, respectively (see FIGS. 5 and 6), whereby the top metal wires 21, 22, and 23 form the source terminal TS, drain terminal TD, and the gate terminal TG as the first input terminal, respectively. Another contact hole 20 is formed through the inter-layer insulating film 16 at a region other than the source region 3 and drain region 4 (see FIG. 6). A region 14a in the semiconductor layer 14 corresponds to the contact hole 20, and has the same conduction type as that of the semiconductor layer 14 and high impurity concentration. The region 14a establishes an ohmic contact between the top metal wire 24 formed inside the contact hole 20 and the semiconductor layer 14, so that the top metal wire 24 forms the substrate terminal TW as the second input terminal.

According to the above arrangement, a 4-terminal element, such as the one shown in FIG. 1, can be realized by electrically separating the adjacent elements relatively easily by merely employing an SOI substrate and forming the field oxide film 15 in the semiconductor layer 14.

As has been discussed, the present embodiment is arranged in such a manner that: element forming regions are electrically separated by means of a separation (field oxide film 15) on the SOI or SOS structure substrate, and a MOSFET is formed in each separated element forming region; and then, the semiconductor layer in each MOSFET is connected to the outside through the contact hole, so that it can be used as an electrode.

The above arrangement realizes a 2-input-1-output circuit by a single element, thereby upgrading the performance of the MOSFET itself. Consequently, when a logic circuit is assembled, not only can a packing density of an integrated circuit be improved, but also the operating rate and yield can be increased while the costs can be reduced.

Figure 7:
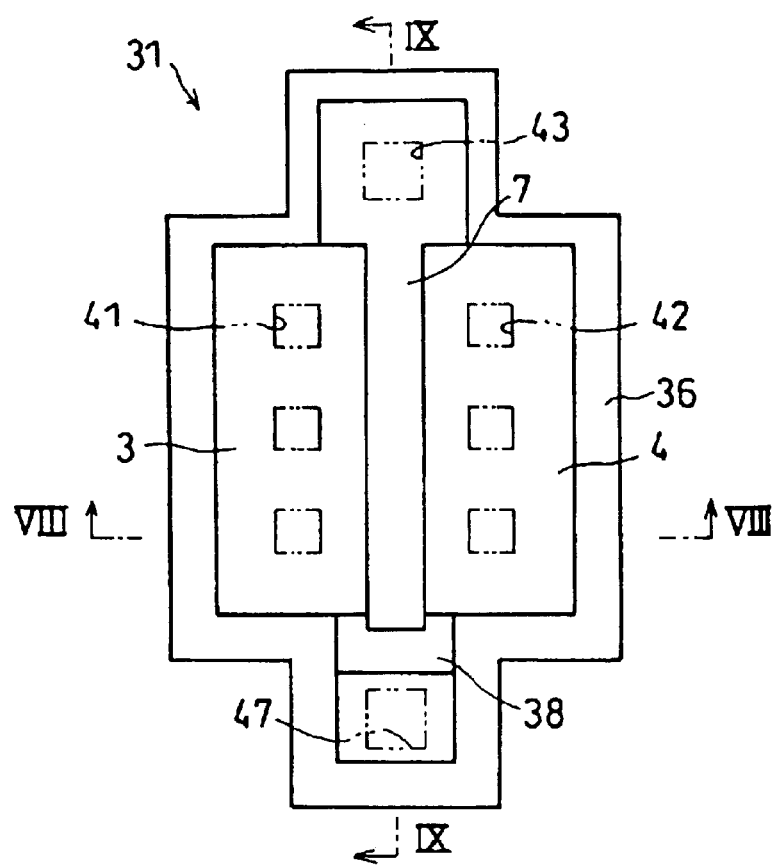
FIG. 7 is a front view of a semiconductor element in accordance with a third embodiment of the present invention, showing a practical application of the arrangement in FIG. 1.
Figure 8:
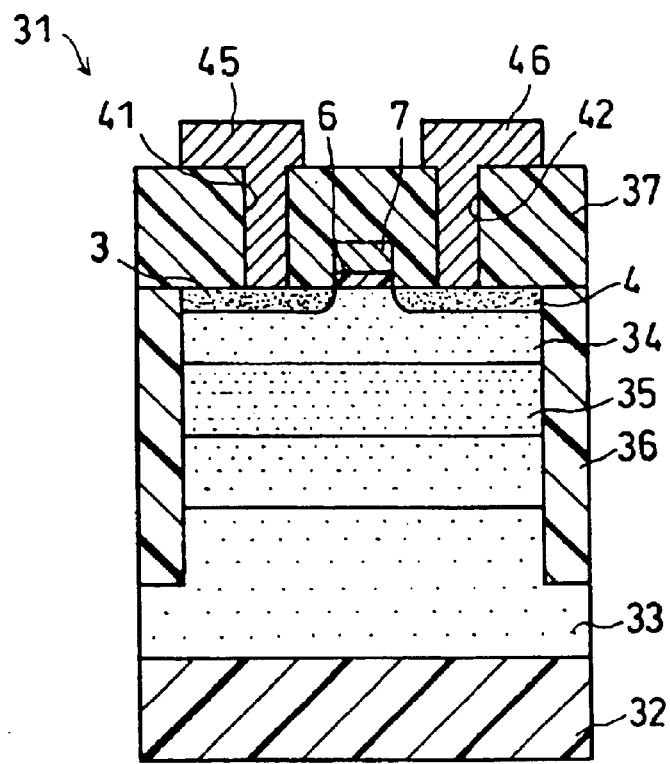
FIG. 8 is a perspective cross section taken on line VIII—VIII in FIG. 7.
Figure 9:
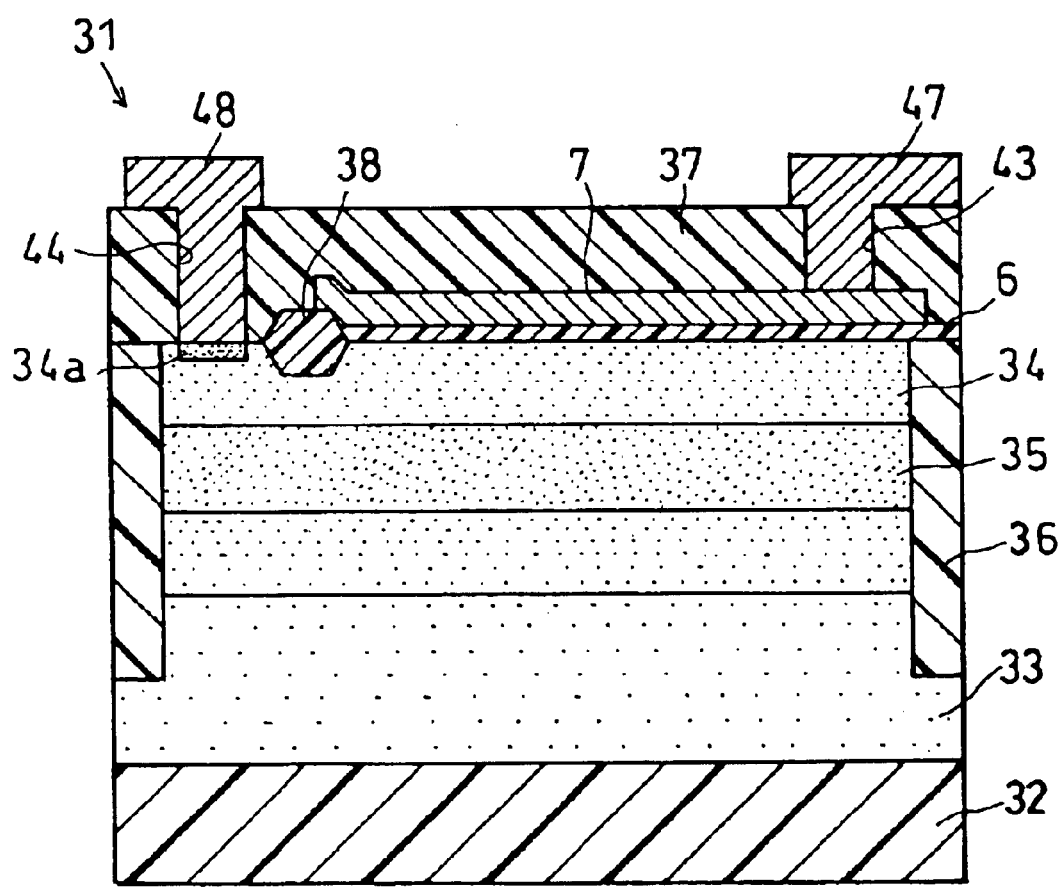
FIG. 9 is a perspective cross section taken on line IX—IX in FIG. 7.

Referring to FIGS. 7 through 9, the following description will describe a third embodiment of the present invention.

FIGS. 7 through 9 are views showing an arrangement of a semiconductor element 31, which is another practical application of the semiconductor element 1 in FIG. 1 in a different structure (bulk type structure) from the semiconductor element 11 in FIGS. 4 through 6. FIG. 7 is a front view. FIG. 8 is a perspective cross section taken on line VIII—VIII in FIG. 7, and FIG. 9 is a perspective cross section taken on line IX—IX in FIG. 7. FIG. 7 omits an inter-layer insulating film and top metal wires for ease of explanation.

The semiconductor element 31 uses a substrate composed of a semiconductor substrate 32, on which a deep well region 33 and a shallow well region 34 having a conduction type opposite to that of the deep well region 33 are layered sequentially in a vertical direction. A heavily doped region 35 is formed in the shallow well region 34 so as to reduce resistance of the same. Each element is electrically separated from the adjacent element by means of an electrical insulating separation region 36. The shallow well region 34 is provided with the source region 3 and drain region 4 of the conduction type opposite to that of the shallow well region 34. Also, the gate electrode 7 is fabricated on the channel region, formed between the source region 3 and drain region 4, through the gate insulating film 6. It should be appreciated that the layer formed between the heavily doped region 35 and deep well region 33 is the shallow well region.

The source region 3, drain region 4, and gate electrode 7 are electrically connected to top metal wires 45, 46, and 47 respectively via contact holes 41, 42, and 43 formed through an inter-layer insulating film 37. The shallow well region 34 is provided with a region 34a which is heavily doped with impurities, at a region other than the source region 3 and drain region 4. The region 34a is electrically connected to a top metal wire 48 via a contact hole 44 formed through the inter-layer insulating film 37 (see FIG. 9), whereby an ohmic contact is established between the shallow well region 34 and top metal wire 48. Also, a field oxide film 38 is formed between the region 34a and gate electrode 7. (see FIG. 9).

The depth and impurity concentration of the source region 3 and drain region 4 in the semiconductor element 31 are approximately 100 nm and $1 \times 10^{20}/cm^3$ or greater, and those of the shallow well region 34 are approximately 1,000 nm and $5 \times 10^{16}/cm^3$ to $1 \times 10^{17}/cm^3$. The depth of the heavily doped region 35 at which the distribution of the impurity concentration reaches its peak is 500 nm to 700 nm, and the peak concentration is approximately $1 \times 10^{18}/cm^3$ to $1 \times 10^{19}/cm^3$. Also, the depth and the impurity concentration of the deep well region 33 are approximately 3 $\mu$m and $5 \times 10^{16}/cm^3$. It should be appreciated, however, that the depth and concentration of impurity of each region are not limited to the foregoing.

Here, the shallow well region 34 can be electrically isolated from the one in the adjacent element by setting the depth of the separation region 36 to at least a sum of the depth of the shallow well region 34 and the width of a depletion layer formed at the junction between the shallow well region 34 and deep well region 33 (to be more accurate, the width of the depletion layer on a portion extending toward the deep well region 33). In contrast, if the depth of the separation region 36 is shorter than the sum of the depth of the shallow well region 34 and the width of the depletion layer formed at the junction between the shallow well region 34 and deep well region 33, conduction between the shallow well regions 33 in the adjacent elements is allowed by means of the depletion layer at the deep well region 33 side, thereby causing unwanted punch-through.

Thus, according to the above arrangement, the adjacent elements can be electrically isolated from each other by providing the separation region 36 that causes a slight increasing of the space which is almost as small as the smallest processable dimensions. Consequently, a bulk type of the 4-terminal semiconductor element 1 as shown in FIG. 1 can be realized by omitting an expensive SOI substrate having high body resistance.

As has been discussed, the present embodiment is arranged in such a manner that: a bulk substrate, in which the deep well region of either P- or N-type and the shallow well region of the other conduction type are formed in the semiconductor substrate, and at least the shallow well region in each element is electrically separated from the one in the adjacent element by means of the separation region, is used; and a MOSFET is formed in each separated element forming region while the shallow well region is electrically connected to the outside through the contact hole provided at a region other than the source region and drain region of the MOSFET, so that the shallow well region can be used as an electrode.

Consequently, even when a bulk substrate is employed, each element can operate independently by preventing unwanted interference between the elements by electrically isolating the shallow well region in each element forming region by means of the separation region. In addition, the shallow well region in the MOSFET is electrically connected to the outside through the contact hole so as to be used as an electrode. Consequently, the above arrangement realizes two inputs: one into the gate and the other into the semiconductor layer.

Moreover, because a 2-input-1-output circuit can be realized by a single element, the performance of the MOSFET itself can be upgraded. Thus, when a logic circuit is assembled, for example, not only the packing density of an integrated circuit can be improved, but also the operating rate and yield can be increased while the costs can be saved. In addition, compared with a case employing an SOI or SOS substrate, the costs and the resistance of the first electrode can be reduced further.

Figure 10:
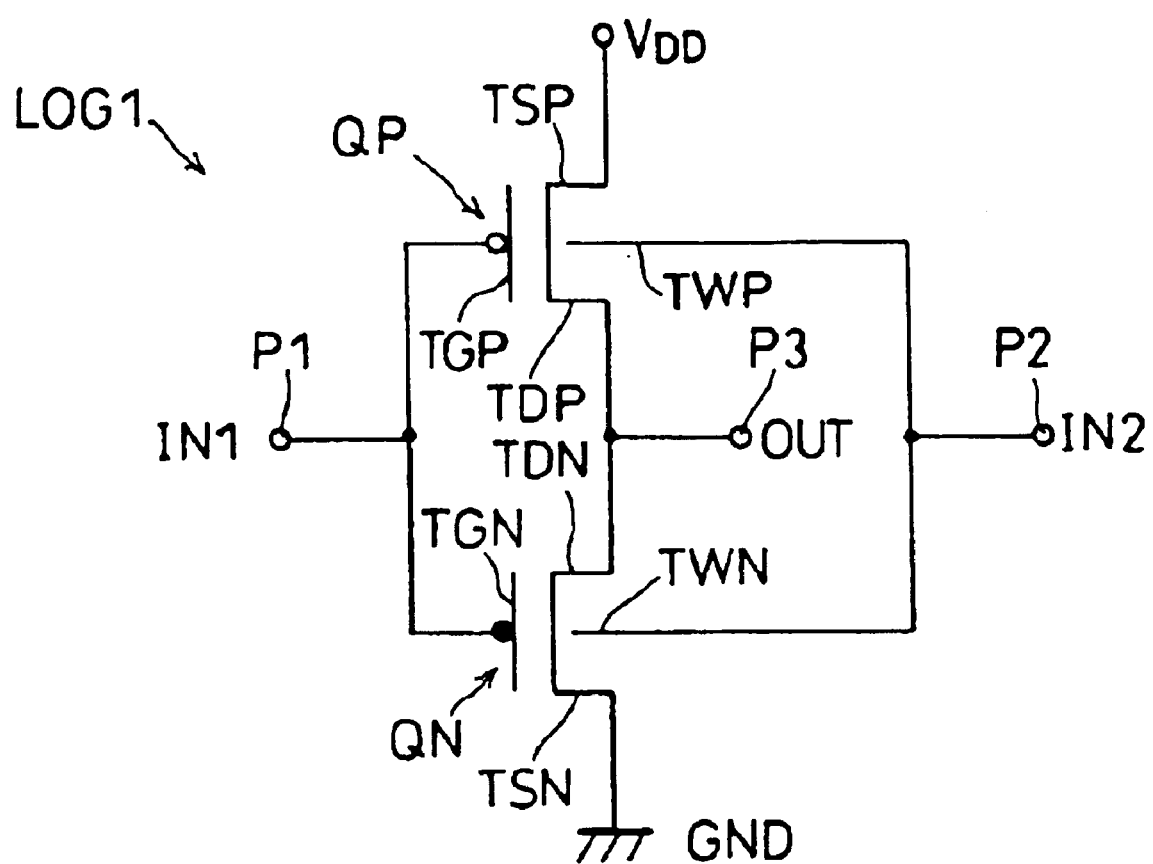
FIG. 10 is a circuit diagram of a logic circuit in accordance with a fourth embodiment of the present invention, in which the semiconductor element in any of FIGS. 1 through 9 is employed.

Referring to FIGS. 10 and 11, the following description will describe a fourth embodiment of the present invention.

FIG. 10 shows a practical application of a unit element, namely, the semiconductor element 1, 11, or 31 by way of a circuit diagram of a logic circuit LOG1 of the CMOS structure. In addition to a typical CMOS inverter structure comprising a pair of a PMOSFET (QP) and a NMOSFET (QN), in which the source TSP of the PMOSFET (QP) is connected to a high level ($V_{DD}$) power source line and the source TSN of the NMOSFET (QN) is connected to a low level (GND) power source line, and the drains TDP and TDN of these MOSFETs (QP and QN) are both connected to the output terminal P3, while the gates TGP and TGN thereof are both connected to the first input terminal P1, the logic circuit LOG1 has an arrangement such that the substrate terminals TWP and TWN of these MOSFETs (QP and QN) are both connected to the second input terminal P2.

Figure 11A:
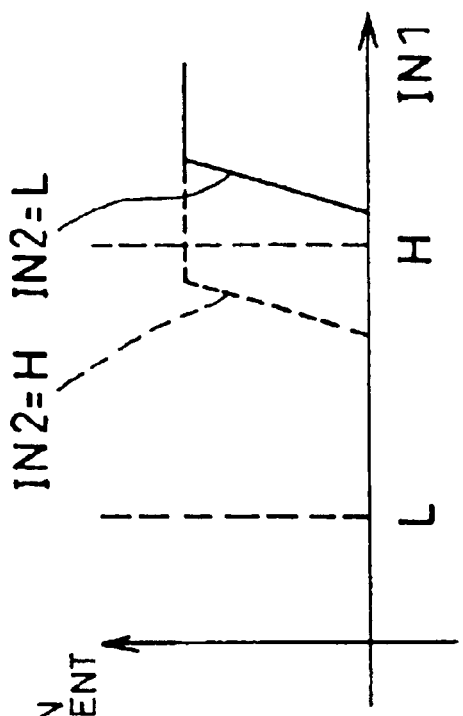
FIGS. 11(a) and 11(b) are graphs showing operating characteristics of the logic circuit in FIG. 10.
Figure 11B:
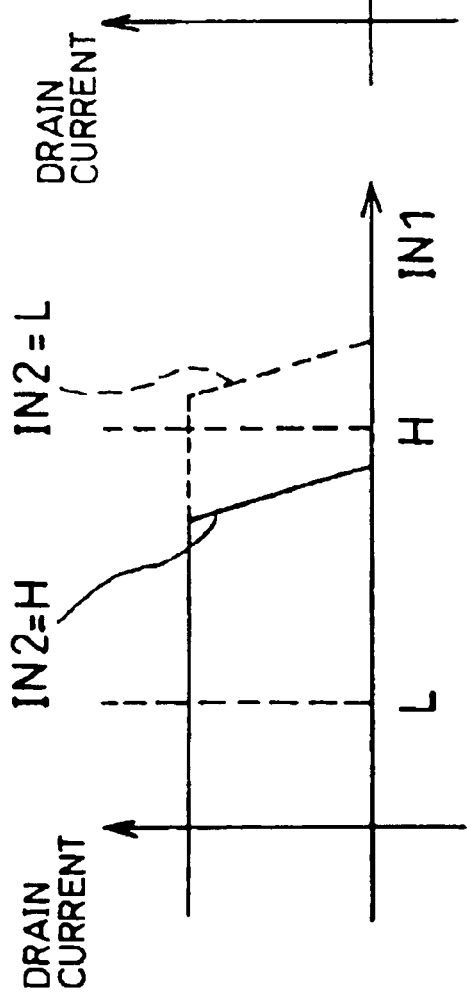

In addition, by adequately selecting the power source voltage $V_{DD}$ and impurity concentration in the channel region, the operating characteristics of the drain current with respect to the inputs IN1 and IN2 of the PMOSFET (QP) are set as shown in FIG. 11(a) and those of the NMOSFET (QN) in FIG. 11(b). In other words, each MOSFET (QP and QN) is arranged in such a manner that, when the input IN2 has the low potential (L), a threshold voltage (at the break point in the graph) becomes higher than the high potential (H), and when the input IN2 has the high potential (H), the threshold voltage becomes lower than the high potential (H) and higher than the low potential (L).

In the above-arranged logic circuit LOG1, when the input IN1 has the low potential (L), the PMOSFET (QP) conducts and NMOSFET (QN) stops conducting regardless of the potential of the input IN2, whereby the output OUT has the high potential (H). In contrast, when the input IN1 has the high potential (H), the PMOSFET (QP) conducts and the NMOSFET (QN) stops conducting if the input IN2 has the low potential (L), whereby the output OUT has the high potential (H). On the other hand, if the input IN2 has the high potential (H), the PMOSFET (QP) stops conducting and the NMOSFET (QN) conducts, whereby the output OUT has the low potential (L). The foregoing operations are set forth in Table 1 below. It is understood from Table 1 below that the logic circuit LOG1 realizes a NAND operation, in which the output OUT has the low potential (L) only when both of the inputs IN1 and IN2 have the high potential (H), and the high potential (H) when at least one of the inputs IN1 and IN2 has the low potential (L).

TABLE 1

| IN1 | IN2 | QP | QN | OUT |
|-----|-----|-----|-----|-----|
| L | L | ON | OFF | H |
| L | H | ON | OFF | H |

TABLE 1-continued

| IN1 | IN2 | QP | QN | OUT |
|-----|-----|-----|-----|-----|
| H | L | ON | OFF | H |
| H | H | OFF | ON | L |

Consequently, a NAND circuit which typically demands four MOSFETs can be now realized by two MOSFETs, thereby improving a packing density of the integral circuit in a reliable manner by upgrading the performance of each element.

As has been discussed, the present embodiment is arranged in such a manner that, in the CMOS inverter structure having a pair of elements of opposite conduction types, the contact holes in these elements form the second input terminal, and the gates, namely the normal inputs, of these elements form the first input terminal.

Consequently, the NAND circuit can be realized by adequately adjusting the potentials of the two inputs or the impurity concentration in the channel region, and the NAND or NOR circuit which conventionally demands four MOSFETs can be now realized by two MOSFETs.

Figure 12:
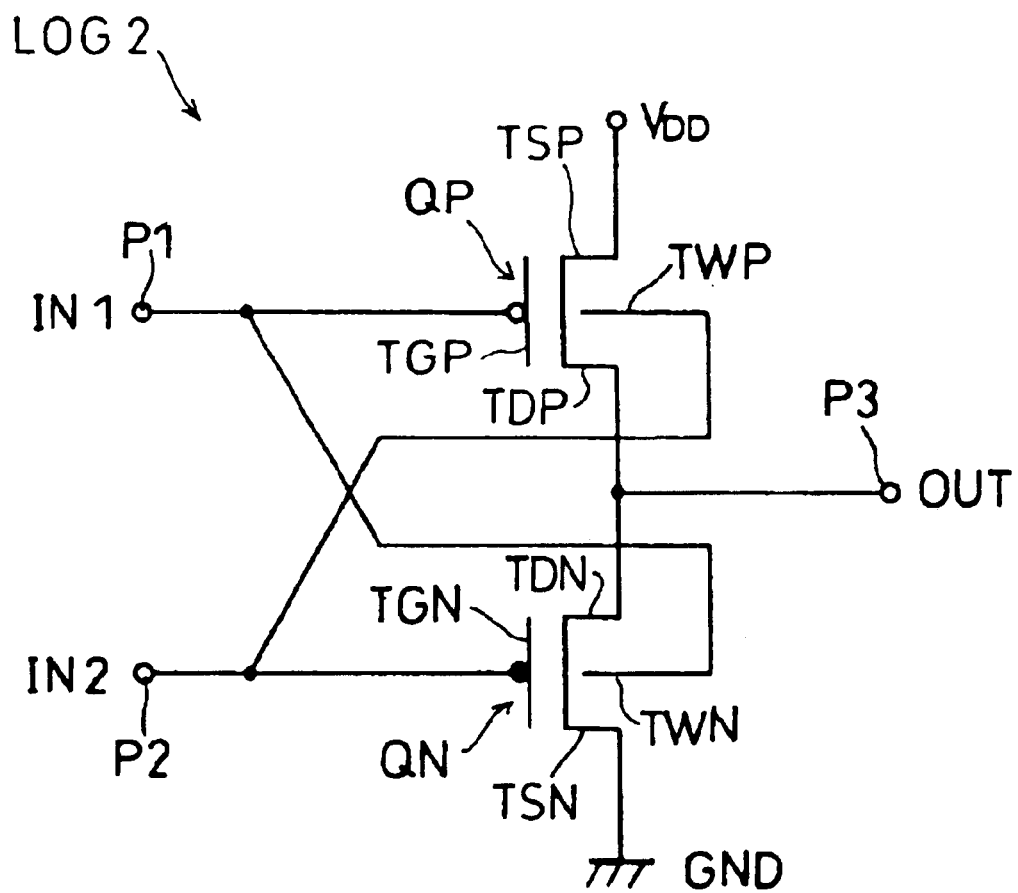
FIG. 12 is a circuit diagram of a logic circuit in accordance with a fifth embodiment of the present invention, in which the semiconductor element in any of FIGS. 1 through 9 is employed.

Referring to FIGS. 12 and 13, the following description will describe a fifth embodiment of the present invention.

FIG. 12 is a circuit diagram of a logic circuit LOG2 in accordance with the fifth embodiment of the present invention. The logic circuit LOG2 is similar to the logic circuit LOG1 in that it includes a pair of MOSFETs of P-type (QP) and N-type (QN), and the source TSP of the PMOSFET (QP) is connected to the high level ($V_{DD}$) power source line, while the source TSN of the NMOSFET (QN) is connected to the low level (GND) power source line, and the drains TDP and TDN of these MOSFETs are both connected to the output terminal P3. However, the logic circuit LOG2 is different from the logic circuit LOG1 in the followings. That is, the gate TGP of the PMOSFET (QP) and the substrate terminal TWN of the NMOSFET (QN) are both connected to the input terminal P1, and the gate TGN of the NMOSFET (QN) and the substrate terminal TWP of the PMOSFET (QP) are both connected to the input terminal P2.

Figure 13A:
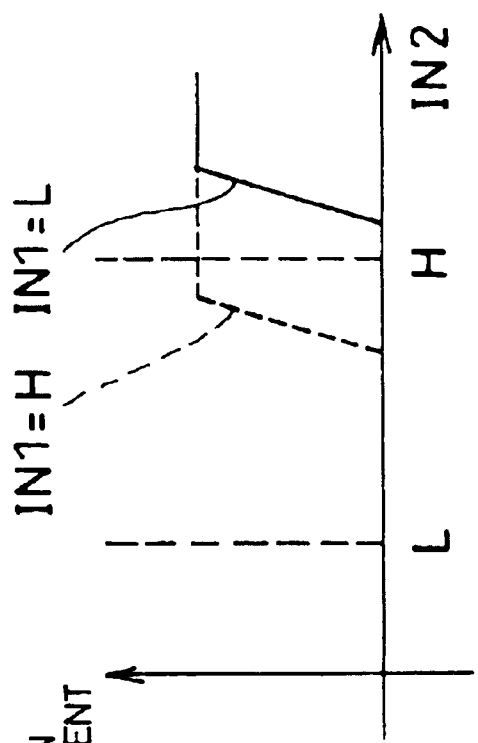
FIGS. 13(a) and 13(b) are graphs showing operating characteristics of the logic circuit in FIG. 12.
Figure 13B:
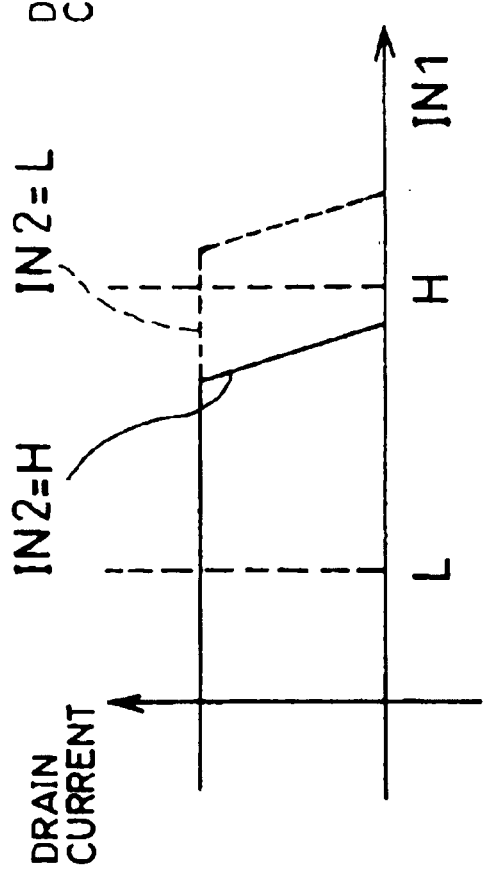

The operating characteristics of the logic circuit LOG2 are set as shown in FIG. 13. In other words, as shown in FIG. 13(a), the PMOSFET (QP) is arranged in such a manner that, when the input IN2 (well potential) has the low potential (L), the threshold voltage becomes higher than the high potential (H), and when the input IN2 has the high potential (H), the threshold voltage becomes lower than the high potential (H) and higher than the low potential (L). In contrast, as shown in FIG. 13(b), the NMOSFET (QN) is arranged in such a manner that, when the input IN1 has the low potential (L), the threshold voltage becomes higher than the high potential (H), and when the input IN1 has the high potential (H), the threshold voltage becomes lower than the high potential (H) and higher than the low potential (L).

Thus, when the input IN1 has the low potential (L), the PMOSFET (QP) conducts and the NMOSFET stops conducting regardless of the level of the input IN2, whereby the output OUT has the high potential (H). Also, when the input IN1 has the high potential (H), if the input IN2 has the low potential (L), the PMOSFET (QP) conducts and the NMOSFET (QN) stops conducting, whereby the output OUT has the high potential (H). Further, when both of the inputs IN1 and IN2 have the high potential (H), the PMOSFET (QP) stops conducting and the NMOSFET (QN) conducts, whereby the output OUT has the low potential (L).

In other words, as set forth in Table 1 above, the output OUT has the low potential (L) only when both of the inputs IN1 and IN2 have the high potential (H), and the high potential (H) otherwise. The aforementioned NAND operation can be also realized by the above arrangement.

As has been described, the present embodiment is arranged in such a manner that, in the CMOS inverter structure having a pair of elements of opposite conduction types, the gates of the PMOSFET and NMOSFET form the first and second input terminals, respectively, and the contact holes in the NMOSFET and PMOSFET also form the first and second input terminals, respectively.

Thus, by adequately adjusting the potentials of the two inputs or impurity concentration in the channel region, the NAND circuit can be realized. Consequently, the NAND circuit which conventionally demands four MOSFETs can be now realized by two MOSFETs.

Referring to FIG. 14, the following description will describe a sixth embodiment of the present invention.

Figure 14B:
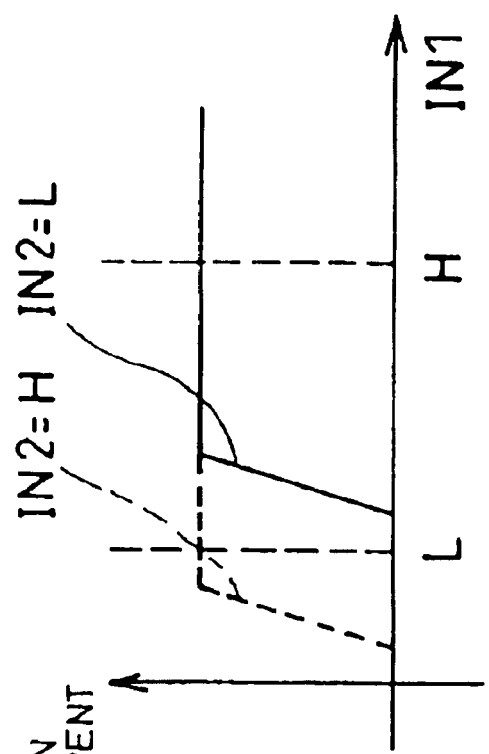
FIGS. 14(a) and 14(b) are graphs showing operating characteristics of a logic circuit in accordance with a sixth embodiment of the present invention.
Figure 14A:
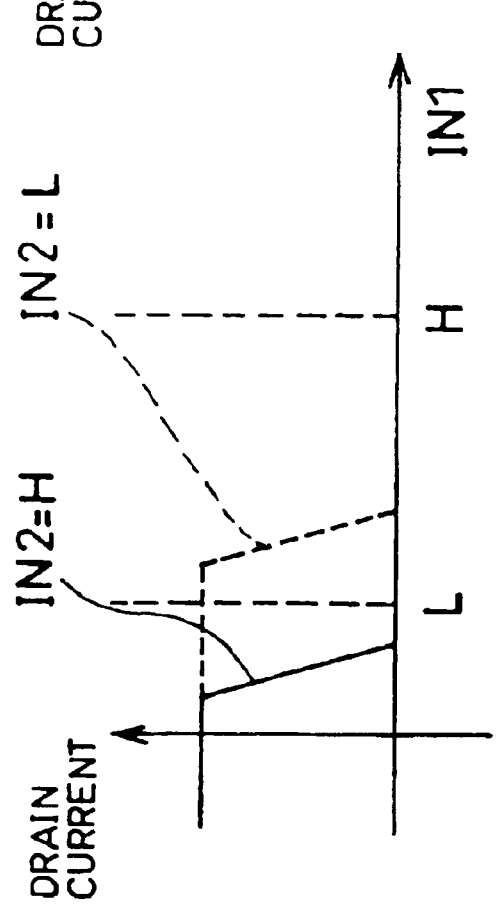

In the present embodiment, the operating characteristics of the MOSFETs (QP and QN) in the logic circuit LOG1 shown in FIG. 10 are not set as shown in FIGS. 11(a) and 11(b), but as shown in FIGS. 14(a) and 14(b). In other words, each MOSFET (QP and QN) is arranged in such a manner that the threshold voltage becomes higher than the lower potential (L) and lower than the high potential (H) when the input IN2 has the low potential (L), and lower than the low potential (L) when the input IN2 has the high potential (H).

Accordingly, when the input IN1 has the high potential (H), the PMOSFET (QP) stops conducting and NMOSFET (QN) conducts regardless of the potential of the input IN2, whereby the output OUT has the low potential (L). When the input IN1 has the low potential (L) and the input IN2 has the high potential (H), the PMOSFET (QP) stops conducting and the NMOSFET (QN) conducts, whereby the output OUT also has the low potential (L). Further, when both of the inputs IN1 and IN2 have the low potential (L), the PMOSFET (QP) conducts and the NMOSFET (QN) stops conducting, whereby the output OUT has the high potential (H). The foregoing operations are set forth in Table 2 below, and the logic circuit LOG1 can realize a NOR operation, in which the output OUT has the high potential (H) only when both of the inputs IN1 and IN2 have the low potential (L), and the low potential (L) otherwise.

TABLE 2

| IN1 | IN2 | QP | QN | OUT |
|-----|-----|-----|-----|-----|
| L | L | ON | OFF | H |
| L | H | OFF | ON | L |
| H | L | OFF | ON | L |
| H | H | OFF | ON | L |

As has been discussed, the NOR circuit which generally demands four MOSFETs can be now realized by two MOSFETs.

Referring to FIG. 15, the following description will describe a seventh embodiment of the present invention.

Figure 15A:
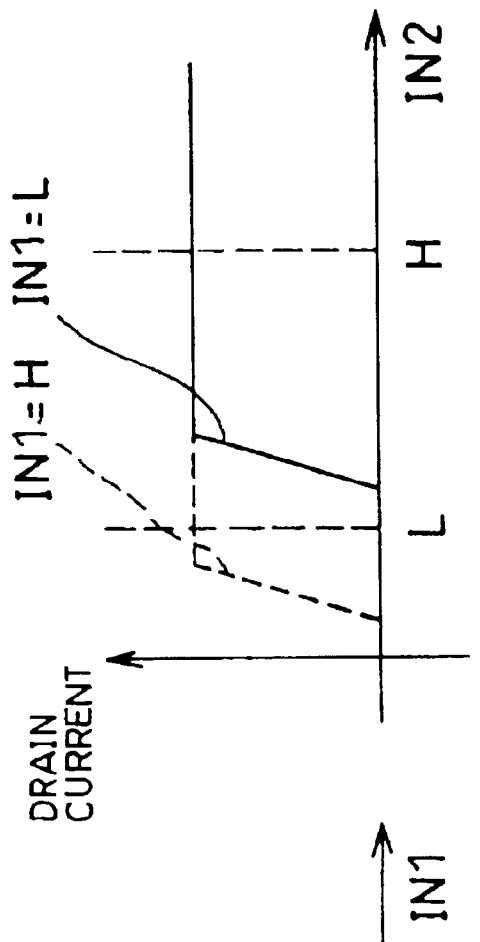
FIGS. 15(a) and 15(b) are graphs showing operating characteristics of a logic circuit in accordance with a seventh embodiment of the present invention.
Figure 15B:
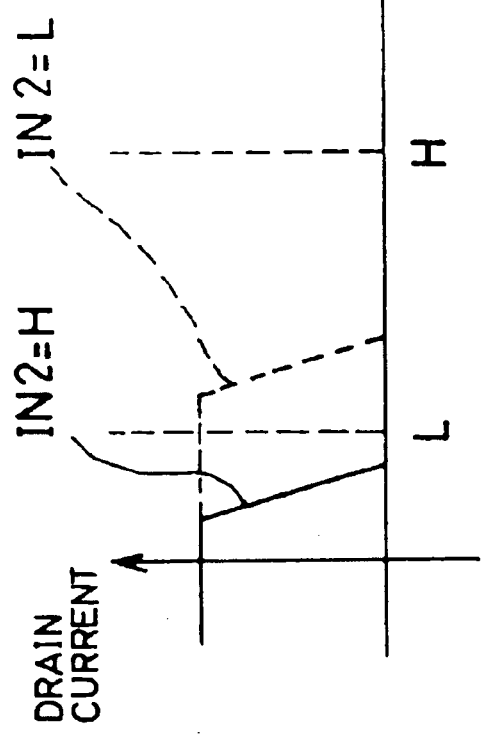

FIG. 15 is a graph showing the operating characteristics in accordance with the seventh embodiment of the present invention, which are adapted to the logic circuit LOG2 shown in FIG. 12. FIG. 15(a) shows the operating characteristics of the PMOSFET (QP) and FIG. 15(b) shows those of the NMOSFET (QN). In other words, each MOSFET is arranged in such a manner that, when both of the well potential (input IN2) of the PMOSFET (QP) and the well potential (input IN1) of the NMOSFET have the low potential (L), the threshold voltage becomes higher than the low potential (L) and lower than the high potential (H), and when the well potential in each MOSFET has the high potential (H), the threshold voltage becomes lower than the low potential (L).

Thus, when the input IN1 has the high potential (H), the PMOSFET (QP) stops conducting and the NMOSFET (QN) conducts regardless of the potential of the input IN2, whereby the output OUT has the low potential (L). Also, when the input IN1 has the low potential (L) and the input IN2 has the high potential (H), the PMOSFET (QP) stops conducting and the NMOSFET (QN) conducts, whereby the output OUT also has the low potential (L). Further, when both of the inputs IN1 and IN2 have the low potential (L), the PMOSFET (QP) conducts and the NMOSFET (QN) stops conducting, whereby the output OUT has the high potential (H).

Thus, the above arrangement can also realize the NOR operation set forth in Table 2 above, in which the output OUT has the high potential (H) only when both of the inputs IN1 and IN2 have the low potential (L), and the low potential (L) otherwise.

Figure 16:
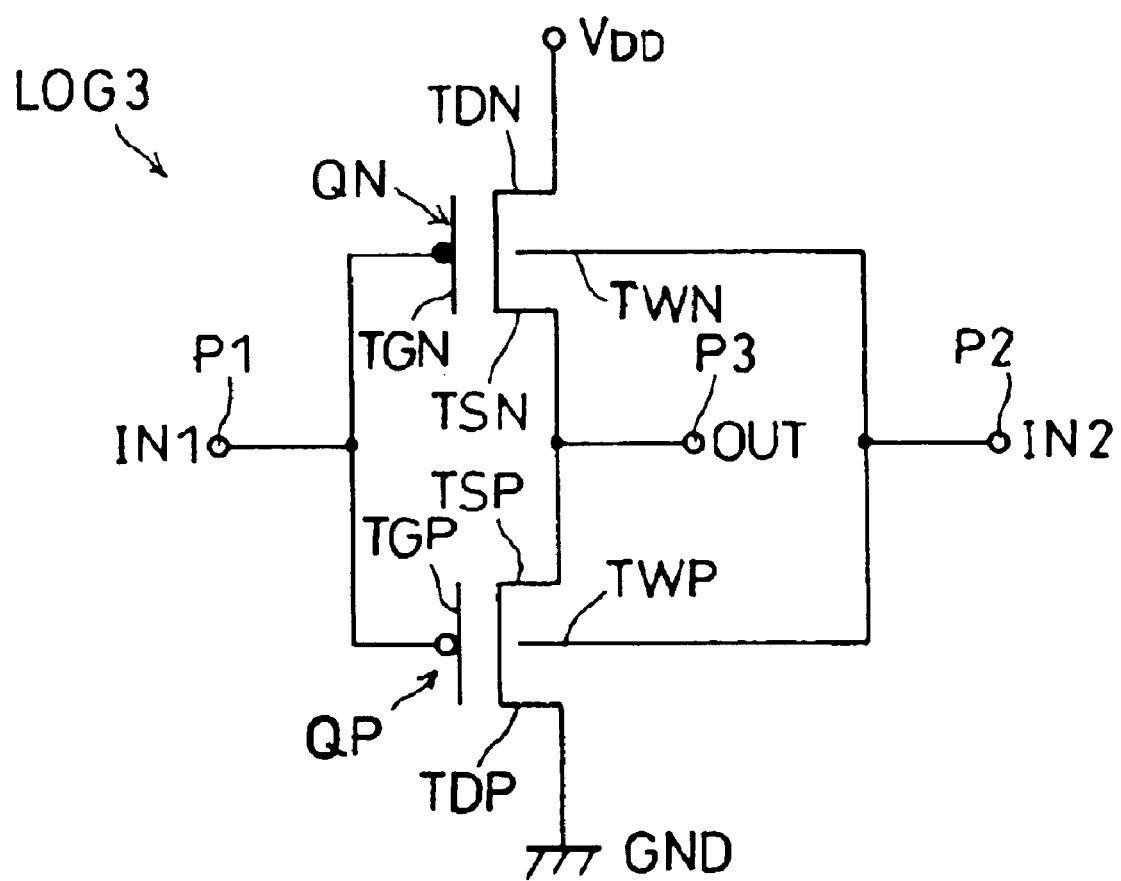
FIG. 16 is a circuit diagram of a logic circuit in accordance with an eighth embodiment of the present invention, in which the semiconductor element in any of FIGS. 1 through 9 is employed.

Referring to FIGS. 16 and 17, the following description will describe an eighth embodiment of the present invention.

FIG. 16 is a circuit diagram of a logic circuit LOG3 in accordance with the eighth embodiment of the present invention. In the logic circuit LOG3, the drain TDN of the NMOSFET (QN) is connected to the high level ($V_{DD}$) power source line, and the drain TDP of the PMOSFET (QP) is connected to the low level (GND) power source line. Also, the sources TSP and TSN of theses MOSFETs (QP and QN) are both connected to the output terminal P3, and the gates TGP and TGN of the same are both connected to the first input terminal P1, while the substrate terminals TWP and TWN of the same are both connected to the second input terminal P2.

Figure 17A:
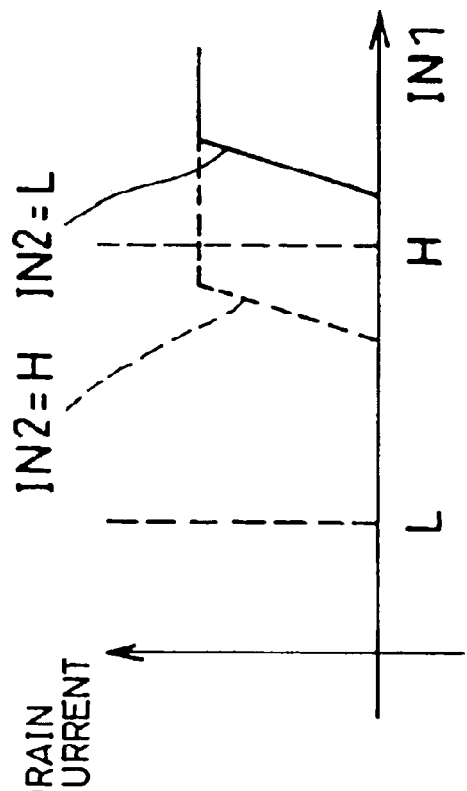
FIGS. 17(a) and 17(b) are graphs showing operating characteristics of the logic circuit in FIG. 16.
Figure 17B:
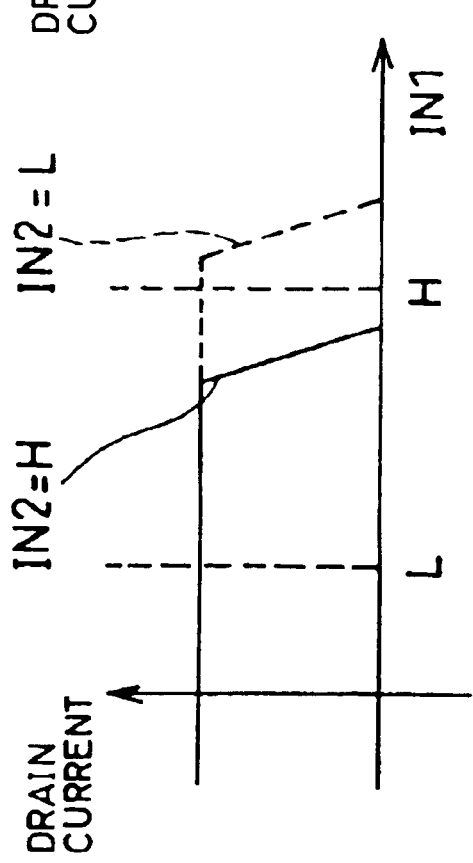

By adequately selecting the power source voltage $V_{DD}$ or impurity concentration in the channel region, the operating characteristics of the drain current with respect to the inputs IN1 and IN2 of the PMOSFET (QP) are set forth in FIG. 17(a) and those of the NMOSFET (QN) in FIG. 17(b).

In other words, each MOSFET (QP and QN) is arranged in such a manner that, when the input IN2 (well potential) has the low potential (L), the threshold voltage becomes higher than the high potential (H), and when the input IN2 has the high potential (H), the threshold voltage becomes lower than the high potential (H) and higher than the low potential (L).

Thus, when the input IN1 has the low potential (L), the PMOSFET (QP) conducts and the NMOSFET stops conducting regardless of the potential of the input IN2, whereby the output OUT has the low potential (L). Also, when the input IN1 has the high potential (H), even if the input IN2 has the low potential (L), the PMOSFET (QP) conducts and the NMOSFET (QN) stops conducting, whereby the output OUT has the low potential (L). Further, when both of the inputs IN1 and IN2 have the high potential (H), the PMOSFET (QP) stops conducting and the NMOSFET (QN) conducts, whereby the output OUT has the high potential (H).

Thus, the logical circuit LOG3 can realize an AND operation as set forth in Table 3 below, in which the output OUT has the high potential (H) only when both of the inputs IN1 and IN2 have the high potential (H), and low potential (L) otherwise.

TABLE 3

| IN1 | IN2 | QP | QN | OUT |
|-----|-----|-----|-----|-----|
| L | L | ON | OFF | L |
| L | H | ON | OFF | L |
| H | L | ON | OFF | L |
| H | H | OFF | ON | H |

Consequently, an AND circuit which generally demands six MOSFETs as described in the "Technical Background" column can be now realized by two MOSFETs.

As has been discussed, the present embodiment is arranged in such a manner that: the elements of opposite conduction types are paired off; the drain of the N-type semiconductor element is fixed at the high potential, and the drain of the P-type semiconductor element is fixed at the low potential; the gates of both the elements form the first input terminal; and the contact holes in the same form the second input terminal.

Thus, by adequately adjusting the potentials of the two inputs or impurity concentration in the channel region, the AND circuit can be realized. Consequently, the AND circuit which conventionally demands six MOSFETs can be now realized by two MOSFETs.

Figure 18:
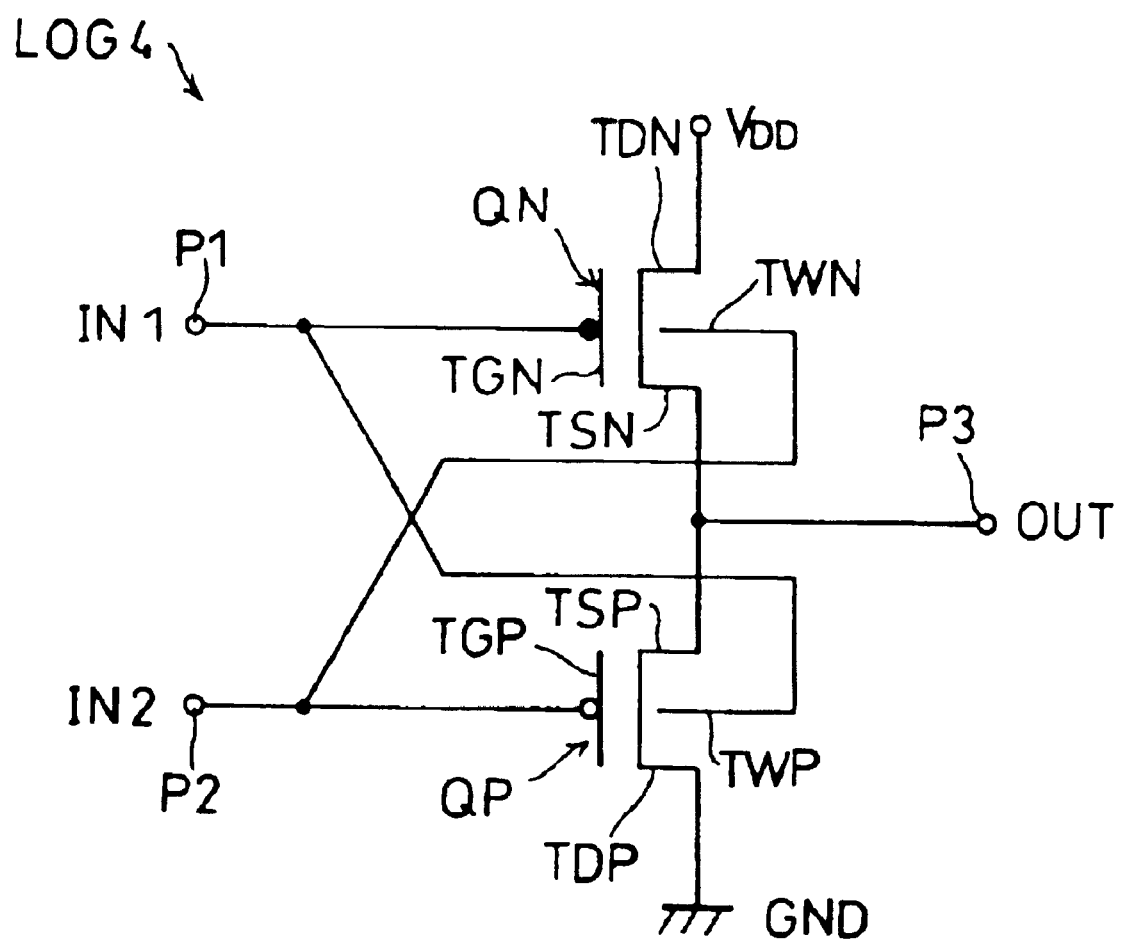
FIG. 18 is a circuit diagram of a logic circuit in accordance with a ninth embodiment of the present invention, in which the semiconductor element in any of FIGS. 1 through 9 is employed.

Referring to FIGS. 18 and 19, the following description will describe a ninth embodiment of the present invention. FIG. 18 is a circuit diagram of a logic circuit LOG4 in accordance with the ninth embodiment of the present invention. The logic circuit LOG4 is similar to the logic circuit LOG3 described above in that: the drain TDN of the NMOSFET (QN) is connected to the high level ($V_{DD}$) power source line, and the drain TDP of the PMOSFET (QP) is connected to the low level (GND) power source line; and the sources TSP and TSN of these MOSFETs are both connected to the output terminal P3. However, the logic circuit LOG4 is different from the logic circuit LOG3 in the following. That is, the gate TGN of the NMOSFET (QN) and the substrate terminal TWP of the PMOSFET (QP) are both connected to the input terminal P1, and the gate TGP of the PMOSFET (QP) and the substrate terminal TWN of the NMOSFET (QN) are both connected to the input terminal P2.

Figure 19A:
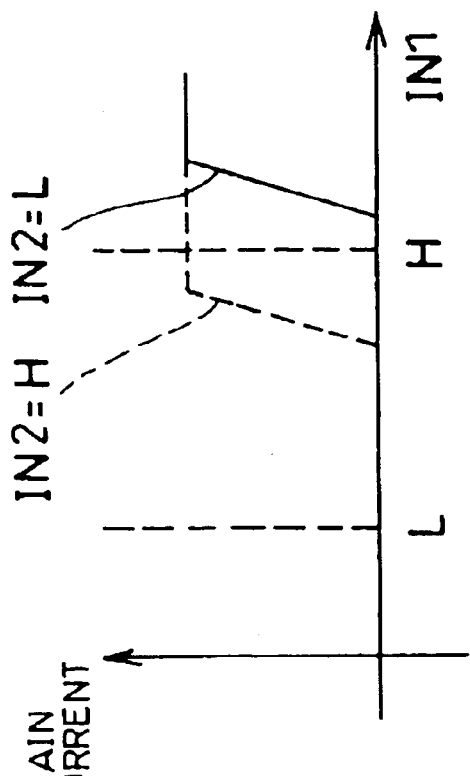
FIGS. 19(a) and 19(b) are graphs showing operating characteristics of the logic circuit in FIG. 18.
Figure 19B:
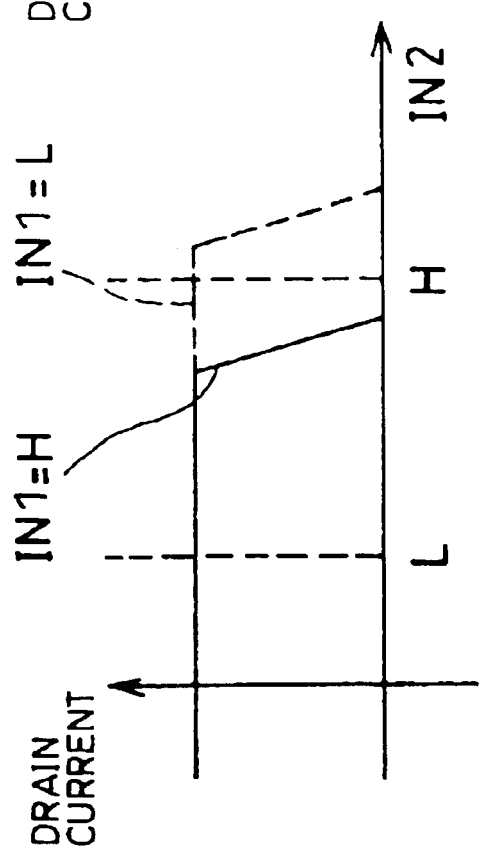

Also, the operating characteristics of the logic circuit LOG4 are set as shown in FIG. 19. To be more specific, as shown in FIG. 19(a), the PMOSFET (QP) is arranged in such a manner that the threshold voltage becomes higher than the high potential (H) when the input IN1 (well potential) has the low potential (L), and lower than the high potential (H) and higher than the low potential (L) when the input IN1 has the high potential (H). In contrast, as shown in FIG. 19(b), the NMOSFET (QN) is arranged in such a manner that the threshold voltage becomes higher than the high potential (H) when the input IN2 has the low potential (L), and lower than the high potential (H) and higher than the low potential (L) when the input IN2 has the high potential (H).

Thus, when the input IN1 has the low potential (L), the PMOSFET (QP) conducts and the NMOSFET (QN) stops conducting regardless of the level of the input IN2, whereby the output OUT has the low potential (L). When the input IN1 has the high potential (H), the PMOSFET (QP) conducts and the NMOSFET stops conducting if the input IN2 has the low potential (L), whereby the output OUT has the low potential (L). Further, when both of the inputs IN1 and IN2 have the high potential (H), the PMOSFET (QP) stops conducting and the NMOSFET (QN) conducts, whereby the output OUT has the high potential (H).

In other words, the above arrangement can also realize the AND operation as set forth in Table 3 above, in which the output OUT has the high potential (H) only when both of the inputs IN1 and IN2 have the high potential (H), and the low potential (L) otherwise.

As has been discussed, the present embodiment is arranged in such a manner that: the elements of opposite conduction types are paired off; the drain of the N-type semiconductor element is fixed at the high potential, and the drain of the P-type semiconductor is fixed at the low potential; both the gate of the N-type semiconductor element and the contact hole in the P-type semiconductor element form the first input terminal; both the gate of the P-type semiconductor element and the contact hole in the N-type semiconductor element form the second input terminal; and the drains of both the MOSFETs form the output terminal.

Thus, by adequately adjusting the potentials of the two inputs or impurity concentration in the channel region, the AND circuit can be realized. Consequently, the AND circuit which conventionally demands six MOSFETs can be now realized by two MOSFETs.

Referring to FIG. 20, the following description will describe a tenth embodiment of the present invention.

FIG. 20 is a graph showing the operating characteristics of the tenth embodiment of the present invention, which are adapted to the logic circuit LOG3 of FIG. 16. FIG. 20(*a*) shows the operating characteristics of the PMOSFET (QP) and FIG. 20(*b*) shows those of the NMOSFET (QN). Each MOSFET (QP and QN) is arranged in such a manner that, when the well potential (input IN2) has the low potential (L), the threshold voltage becomes higher than the low potential (L) and lower than the high potential (H), and lower than the low potential (L) when the input IN2 has the high potential (H).

Thus, when the input IN1 has the high potential (H), the PMOSFET (QP) stops conducting and the NMOSFET (QN) conducts regardless of the potential of the input IN2, whereby the output OUT has the high potential (H). Also, when the input IN1 has the low potential (L) and the input IN2 has the high potential (H), the PMOSFET (QP) stops conducting and the NMOSFET (QN) conducts, whereby the output OUT also has the high potential (H). Further, when both of the inputs IN1 and IN2 have the low potential (L), the PMOSFET (QP) conducts and the NMOSFET (QN) stops conducting, whereby the output OUT has the low potential (L).

In other words, it is understood that the above arrangement can realize an OR operation as set forth in Table 4 below, in which the output OUT has the low potential (L) only when both of the inputs IN1 and IN2 have the low potential (L), and the high potential (H) otherwise.

TABLE 4

| IN1 | IN2 | QP  | QN  | OUT |
|-----|-----|-----|-----|-----|
| L   | L   | ON  | OFF | L   |
| L   | H   | OFF | ON  | H   |
| H   | L   | OFF | ON  | H   |
| H   | H   | OFF | ON  | H   |

Consequently, an OR circuit which generally demands six MOSFETs as previously described can be now realized by two MOSFETs.

Figure 21A:
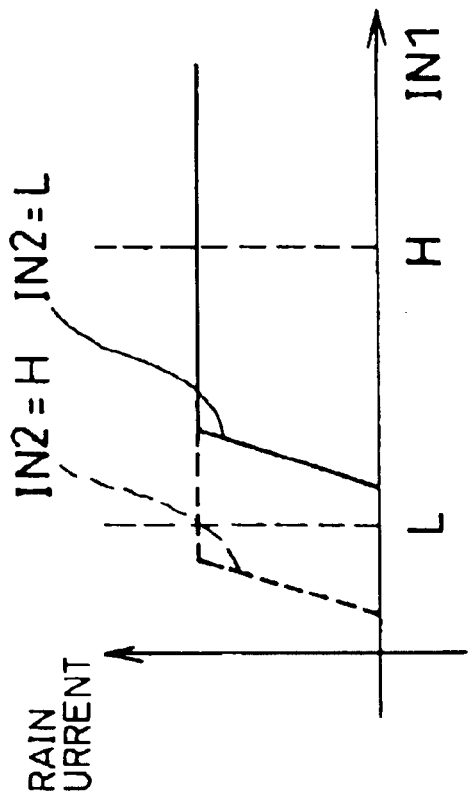
FIGS. 21(a) and 21(b) are graphs showing operating characteristics of a logic circuit in accordance with an eleventh embodiment of the present invention.
Figure 21B:
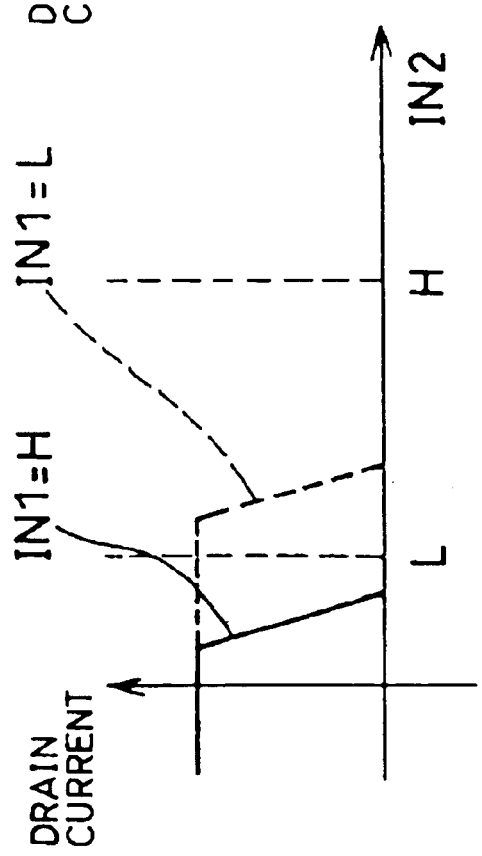
Figure 22:
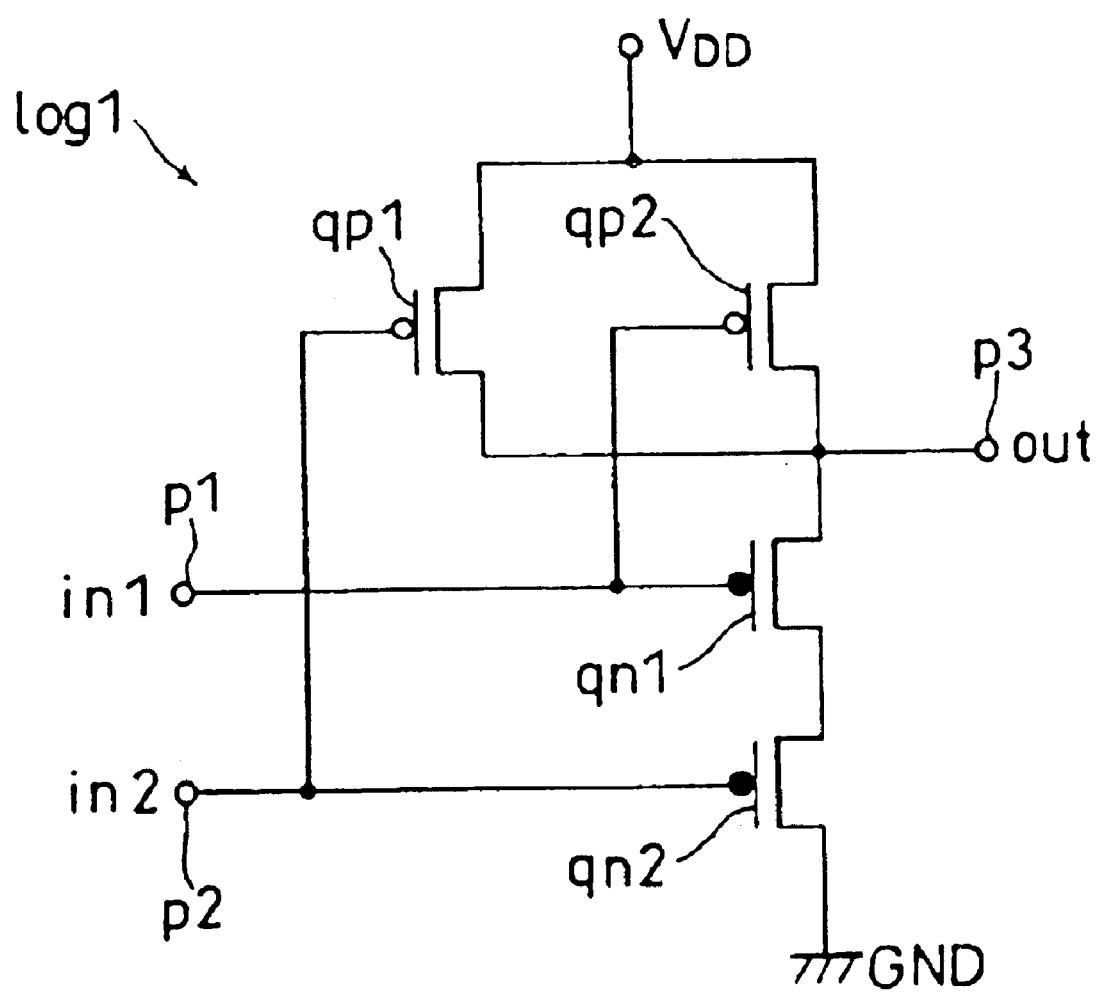
FIG. 22 is a circuit diagram showing an example of a logic circuit composed of typical conventional MOSFET elements.
Figure 23:
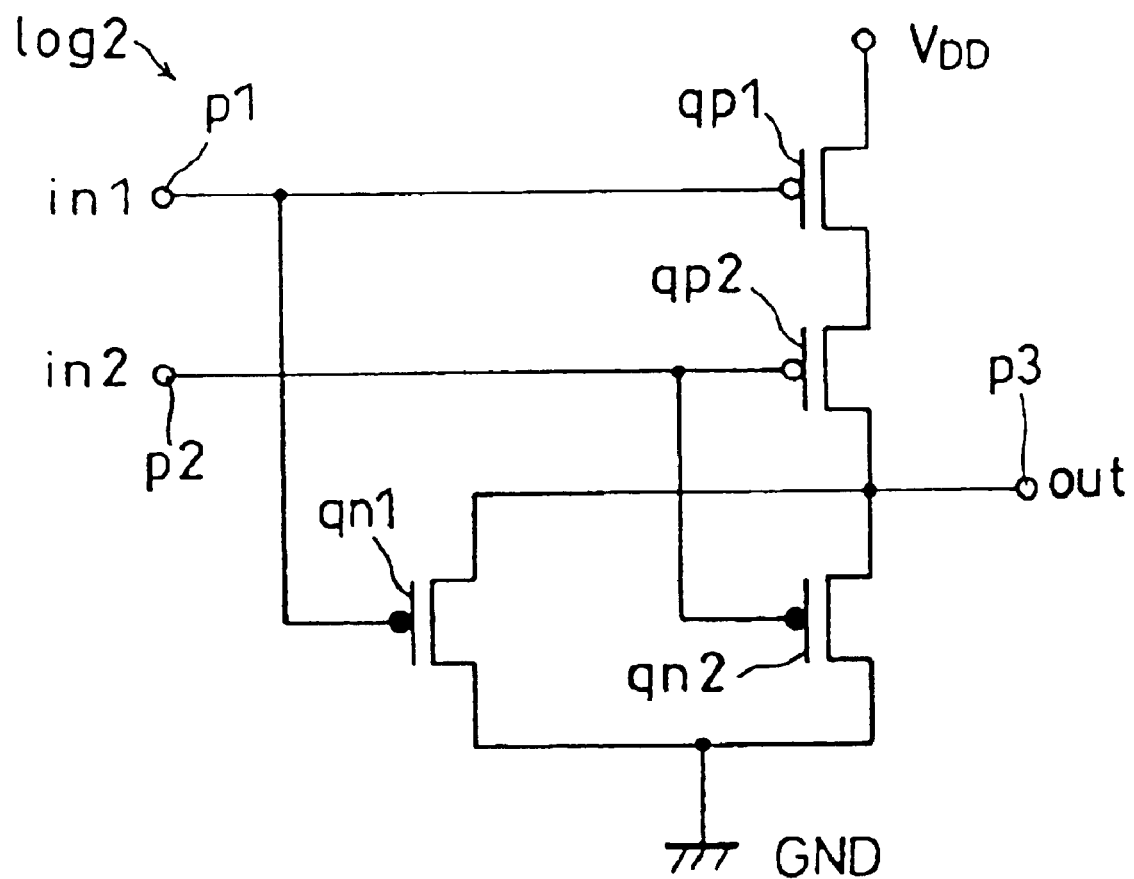
FIG. 23 is a circuit diagram showing another example of the logic circuit composed of typical conventional MOSFET elements.

Referring to FIG. 21, the following description will describe an eleventh embodiment of the present invention.

FIG. 21 is a graph showing the operating characteristics of the eleventh embodiment of the present invention, which are adapted to the logic circuit LOG4 of FIG. 18. FIG. 21(*a*) shows the operating characteristics of the PMOSFET (QP) and FIG. 21(*b*) shows those of the NMOSFET (QN). In other words, each MOSFET is arranged in such a manner that, when the well potential (input IN1) of the PMOSFET (QP) and the well potential (input IN2) of the NMOSFET (QN) have the low potential (L), the threshold voltage becomes higher than the low potential (L) and lower than the high potential (H), and when the well potential in each MOSFET has the high potential (H), the threshold voltage becomes lower than the low potential (L).

Thus, when the input IN1 has the high potential (H), the PMOSFET (QP) stops conducting and the NMOSFET conducts regardless of the potential of the input IN2. Also, when the input IN1 has the low potential (L) and the input IN2 has the high potential (H), the PMOSFET (QP) stops conducting and the NMOSFET (QN) conducts, whereby the output OUT also has the high potential (H). Further, when both of the inputs IN1 and IN2 have the low potential (L), the PMOSFET (QP) conducts and the NMOSFET (QN) stops conducting, whereby the output OUT has the low potential (L).

In other words, the above arrangement can also realize the OR operation as set forth in Table 4 above, in which the output OUT has the low potential (L) only when the inputs IN1 and IN2 have the low potential (L), and the high potential (H) otherwise.

As has been discussed, the present embodiment is arranged in such a manner that the gate and contact hole form the separate input terminals, into which input signals synchronized to each other based on a clock or the like are inputted, respectively.

Consequently, the above arrangement does not realize a simple ON/OFF operation of the 1-input-1-output circuit, but an operation of the 2-input-1-output logic circuit, thereby making it possible to assemble the logic circuit with a fewer elements.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Industrial Applicability

As has been discussed, the semiconductor device of the present invention is useful as logical operation circuits of various kinds, and particularly suitable to logical operation circuits for which a packing density should be improved by upgrading the performance of each element, and the operating rate and yield should be increased while reducing the costs.

What is claimed is:

1. A semiconductor device comprising a plurality of semiconductor elements, each being provided with a source region having a source terminal and a drain region having a drain terminal in a well formed in a semiconductor layer, and a gate terminal fabricated atop a channel region which receives a first input signal, wherein the channel region is formed between said source region and drain region and a gate electrode receives the first input signal to influence the channel region through a gate insulating film, wherein:

each of said semiconductor elements is electrically separated from the others;

said well in each of said semiconductor elements is provided with a substrate terminal which receives a second input signal through a contact hole formed therein at a region other than said source region and drain region; and each of the first and second input signals is any given binary signal provided externally as user data.

2. The semiconductor device of claim 1, wherein operating characteristics are changed by adjusting impurity concentration in said channel region and levels of a high voltage and a low voltage applied to said gate terminal and substrate terminal.

3. The semiconductor device of claim 1, wherein said semiconductor layer in each of said semiconductor elements is electrically separated from each other by means of an oxide film.

4. The semiconductor device of claim 1, wherein:

the semiconductor elements are organized into pairs of semiconductor elements, each pair of semiconductor elements including a P-type semiconductor element and an N-type semiconductor element;

for each pair of semiconductor elements,
a high potential is supplied to a source terminal of said P-type semiconductor element and a low potential is supplied to a source terminal of said N-type semiconductor element;
a gate terminal of said P-type semiconductor element is connected to a gate terminal of said N-type semiconductor element thereby to form the first input terminal;
a substrate terminal of said P-type semiconductor element is connected to a substrate terminal of said N-type semiconductor element, thereby to form the second input terminal; and
a drain terminal of said P-type semiconductor element is connected to a drain terminal of said N-type semiconductor element, thereby to form an output terminal.

5. The semiconductor device of claim 4, wherein each of said P-type semiconductor element and N-type semiconductor element is arranged in such a manner that a threshold voltage becomes higher than said high potential when said second input terminal is supplied with said low potential, and lower than said high potential and higher than said low potential when said second input terminal is supplied with said high potential.

6. The semiconductor device of claim 4, wherein each of said P-type semiconductor element and N-type semiconductor element is arranged in such a manner that a threshold voltage becomes higher than said low potential and lower than said high potential when said second input terminal is supplied with said low potential, and lower than said low potential when said second input terminal is supplied with said high potential.

7. The semiconductor device of claim 1, wherein each of said semiconductor element is specified so that when said substrate terminal is at low potential, a threshold voltage for the gate terminal is higher than high potential, and when said substrate terminal is at the high potential, the threshold voltage for the gate terminal is higher than the low potential and lower than the high potential.

8. The semiconductor device of claim 1, wherein each of said semiconductor element is specified so that when said substrate terminal is at low potential, a threshold voltage for the gate terminal is higher than low potential and lower than high potential, and when said substrate terminal is at the high potential, the threshold voltage for the gate terminal is lower than the low potential.

9. A semiconductor device comprising a plurality of semiconductor elements, each being provided with a source region having a source terminal and a drain region having a drain terminal in a well formed in a semiconductor layer, and a gate terminal fabricated atop a channel region, formed between said source region and drain region, with a gate insulating film between the gate terminal and the channel region, wherein:

each of said semiconductor elements is electrically separated from the others;

said well in each of said semiconductor elements is provided with a substrate terminal through a contact hole formed therein at a region other than said source region and drain region;

the semiconductor elements are organized into pairs of semiconductor elements, each pair of semiconductor elements including a P-type semiconductor element and an N-type semiconductor element;

for each pair of semiconductor elements,
a high potential is supplied to a source terminal of said P-type semiconductor element and a low potential is supplied to a source terminal of said N-type semiconductor element;
a gate terminal of said P-type semiconductor element and a substrate terminal of said N-type semiconductor element are connected to each other, thereby to form a first input terminal;
a gate terminal of said N-type semiconductor element and a substrate terminal of said P-type semiconductor element are connected to each other, thereby to form a second input terminal; and
a drain terminal of said P-type semiconductor element is connected to a drain terminal of said N-type semiconductor element thereby to form an output terminal.

10. The semiconductor device of claim 9, wherein:

said P-type semiconductor element is arranged in such a manner that a threshold voltage becomes higher than said high potential when said second input terminal is supplied with said low potential, and lower than said high potential and higher than said low potential when said second input terminal is supplied with said high potential; and said N-type semiconductor element is arranged in such a manner that a threshold voltage becomes higher than said high potential when said first input terminal is supplied with said low potential, and lower than said high potential and higher than said low potential when said first input terminal is supplied with said high potential.

11. The semiconductor device of claim 9, wherein:

said P-type semiconductor element is arranged in such a manner that a threshold voltage becomes lower than said low potential when said second input terminal is supplied with said high potential; and lower than said high potential and higher than said low potential when said second input terminal is supplied with said low potential; and said N-type semiconductor element is arranged in such a manner that a threshold voltage becomes lower than said low potential when said first input terminal is supplied with said high potential, and lower than said high potential and higher than said low potential when said first input terminal is supplied with said low potential.

12. A semiconductor device comprising a plurality of semiconductor elements, each being provided with a source region having a source terminal and a drain region having a drain terminal in a well formed in a semiconductor layer, and a gate terminal fabricated atop a channel region, formed between said source region and drain region, with a gate insulating film between the gate terminal and the channel region, wherein:

each of said semiconductor elements is electrically separated from the others;

said well in each of said semiconductor elements is provided with a substrate terminal through a contact hole formed therein at a region other than said source region and drain region;

the semiconductor elements arc organized into pairs of semiconductor elements, each pair of semiconductor elements including a P-type semiconductor element and an N-type semiconductor element;

for each pair of semiconductor elements, a drain terminal of said N-type semiconductor element is supplied with a high potential and a drain terminal of said P-type semiconductor element is supplied with a low potential;

a gate terminal of said P-type semiconductor element is connected to a gate terminal of said N-type semiconductor element, thereby to form a first input terminal;

a substrate terminal of said P-type semiconductor element is connected to a substrate terminal of said N-type semiconductor element, thereby to form a second input terminal; and a source terminal of said P-type semiconductor element is connected to a source terminal of said N-type semiconductor element, thereby to form an output terminal.

13. The semiconductor device of claim 12, wherein each of said P-type semiconductor element and N-type semiconductor element is arranged in such a manner that a threshold voltage becomes higher than said high potential when said second input terminal is supplied with said low potential, and lower than said high potential and higher than said low potential when said second input terminal is supplied with said high potential.

14. The semiconductor device of claim 12, wherein each of said P-type semiconductor element and N-type semiconductor element is arranged in such a manner that a threshold voltage becomes higher than said low potential and lower than said high potential when said second input terminal is supplied with said low potential, and lower than said low potential when said second input terminal is supplied with said high potential.

15. A semiconductor device comprising a plurality of semiconductor elements, each being provided with a source region having a source terminal and a drain region having a drain terminal in a well formed in a semiconductor layer, and a gate terminal fabricated atop a channel region which receives a first input signal, wherein the channel region is formed between said source region and drain region and a gate electrode receives the first input signal to influence the channel region through a gate insulating film, wherein:

each of said semiconductor elements is electrically separated from the others;

said well in each of said semiconductor elements is provided with a substrate terminal which receives a second input signal through a contact hole formed therein at a region other than said source region and drain region: and the first and second input signals are different signals that are synchronized with each other, wherein;

the semiconductor elements are organized into pairs of semiconductor elements, each pair of semiconductor elements including a P-type semiconductor element and an N-type semiconductor element;

for each pair of semiconductor elements, a high potential is supplied to a drain terminal of said N-type semiconductor element and a low potential is supplied to a drain terminal of said P-type semiconductor element;

a gate terminal of said N-type semiconductor element is connected to a substrate terminal of said P-type semiconductor element, thereby to form the first input terminal;

a gate terminal of said P-type semiconductor element is connected to a substrate terminal of said N-type semiconductor element, thereby to form the second input terminal; and a source terminal of said P-type semiconductor element is connected to a source terminal of said N-type semiconductor element, thereby to form an output terminal.

16. The semiconductor device or claim 15, wherein:

said P-type semiconductor element is arranged in such a manner that a threshold voltage becomes higher than said high potential when said first input terminal is supplied with said low potential, and lower than said high potential and higher than said low potential when said first input terminal is supplied with said high potential; and said N-type semiconductor element is arranged in such a manner that a threshold voltage becomes higher than said high potential when said second input terminal is supplied with said low potential, and lower than said high potential and higher than said low potential when said second input terminal is supplied with said high potential.

17. The semiconductor device of claim 15, wherein:

said P-type semiconductor element is arranged in such a manner that a threshold voltage becomes lower than said low potential when said first input terminal is supplied with said high potential, and lower than said high potential and higher than said low potential when said first input terminal is supplied with said low potential; and said N-type semiconductor element is arranged in such a manner that a threshold voltage becomes lower than said low potential when said second input terminal is supplied with said high potential and lower than said high potential and higher than said low potential when said second input terminal is supplied with said low potential.

* * * * *